(12) United States Patent
McGowan et al.

(10) Patent No.: US 8,443,323 B1
(45) Date of Patent: *May 14, 2013

(54) METHOD AND SYSTEM FOR IMPLEMENTING A STRUCTURE TO IMPLEMENT I/O RINGS AND DIE AREA ESTIMATIONS

(75) Inventors: Miles P. McGowan, San Jose, CA (US); Thaddeus Clay McCracken, Portland, OR (US)

(73) Assignee: Cadence Design Systems, Inc., San Jose, CA (US)

( * ) Notice: Subject to any disclaimer, the term of this patent is extended or adjusted under 35 U.S.C. 154(b) by 100 days.

This patent is subject to a terminal disclaimer.

(21) Appl. No.: 12/978,313

(22) Filed: Dec. 23, 2010

Related U.S. Application Data

(60) Provisional application No. 61/323,292, filed on Apr. 12, 2010.

(51) Int. Cl.
*G06F 17/50* (2006.01)

(52) U.S. Cl.
USPC ........... 716/122; 716/111; 716/130; 716/124; 716/131; 716/132; 716/136; 703/16

(58) Field of Classification Search .................. 716/111, 716/122, 130, 124, 131, 132, 136; 703/16
See application file for complete search history.

(56) References Cited

U.S. PATENT DOCUMENTS

| | | | | |
|---|---|---|---|---|
| 3,613,089 A * | 10/1971 | Karp | ............................. | 709/244 |
| 3,644,937 A * | 2/1972 | Isett | ............................. | 716/129 |
| 4,613,941 A * | 9/1986 | Smith et al. | ..................... | 716/55 |
| 5,155,065 A * | 10/1992 | Schweiss | ....................... | 438/599 |
| 5,159,678 A * | 10/1992 | Wengelski et al. | ........... | 711/153 |
| 5,552,333 A | 9/1996 | Cheung et al. | | |
| 5,555,266 A * | 9/1996 | Buchholz et al. | ............. | 370/347 |
| 5,577,237 A * | 11/1996 | Lin | ................ | 713/500 |
| 6,212,666 B1 * | 4/2001 | Gohl et al. | .................... | 716/108 |
| 6,243,836 B1 * | 6/2001 | Whalen | .......................... | 714/45 |
| 6,377,561 B1 * | 4/2002 | Black et al. | .................. | 370/330 |
| 6,389,513 B1 * | 5/2002 | Closson | ....................... | 711/129 |
| 6,445,707 B1 * | 9/2002 | Iuoras et al. | ............. | 370/395.43 |
| 6,457,157 B1 * | 9/2002 | Singh et al. | .................. | 716/122 |
| 6,467,025 B1 * | 10/2002 | Taylor | ........................... | 711/118 |
| 6,550,047 B1 | 4/2003 | Becker | | |
| 6,826,741 B1 | 11/2004 | Johnson et al. | | |
| 6,836,026 B1 | 12/2004 | Ali et al. | | |
| 7,080,341 B2 * | 7/2006 | Eisenstadt et al. | ............. | 326/81 |
| 7,788,195 B1 * | 8/2010 | Subramanian et al. | ......... | 706/20 |

(Continued)

FOREIGN PATENT DOCUMENTS

JP 08186176 A * 7/1996
JP 2002026130 A * 1/2002

OTHER PUBLICATIONS

Non-Final Office Action dated Jan. 4, 2013 for U.S. Appl. No. 13/219,517.

*Primary Examiner* — Phallaka Kik

(74) *Attorney, Agent, or Firm* — Vista IP Law Group, LLP

(57) ABSTRACT

Disclosed are improved methods, systems, and computer program products for implementing an I/O ring structure to generate an I/O ring arrangement for an electronic design, and for performing chip planning and estimation based upon the I/O ring arrangement. Nodes in the I/O ring structure are used to track objects in the I/O ring.

48 Claims, 28 Drawing Sheets

U.S. PATENT DOCUMENTS

| | | | |
|---|---|---|---|
| 7,871,831 B1 * | 1/2011 | Yao et al. | 438/14 |
| 7,966,595 B1 * | 6/2011 | Chong et al. | 716/118 |
| 8,219,965 B2 | 7/2012 | Kobayashi | |
| 2004/0225972 A1 | 11/2004 | Oeltjen et al. | |
| 2005/0160389 A1 | 7/2005 | Arai et al. | |
| 2006/0080626 A1 * | 4/2006 | Ohba et al. | 716/6 |
| 2007/0156982 A1 * | 7/2007 | Meiri et al. | 711/162 |
| 2008/0092148 A1 * | 4/2008 | Moertl et al. | 719/321 |
| 2009/0217030 A1 * | 8/2009 | Premkumar et al. | 713/153 |
| 2009/0300565 A1 * | 12/2009 | Chiu et al. | 716/6 |
| 2010/0131913 A1 * | 5/2010 | Zou et al. | 716/9 |
| 2010/0198098 A1 * | 8/2010 | Osorio et al. | 600/544 |
| 2011/0239177 A1 * | 9/2011 | Chong et al. | 716/119 |
| 2011/0265056 A1 * | 10/2011 | Kobayashi | 716/119 |

* cited by examiner

Fig. 1C

| Node 150 |
|---|
| Node ID |
| I/O Name/Color |
| Height |
| Width |
| Stackable? |
| Stacked Nodes |
| Pointers forward and backwards |
| Side |

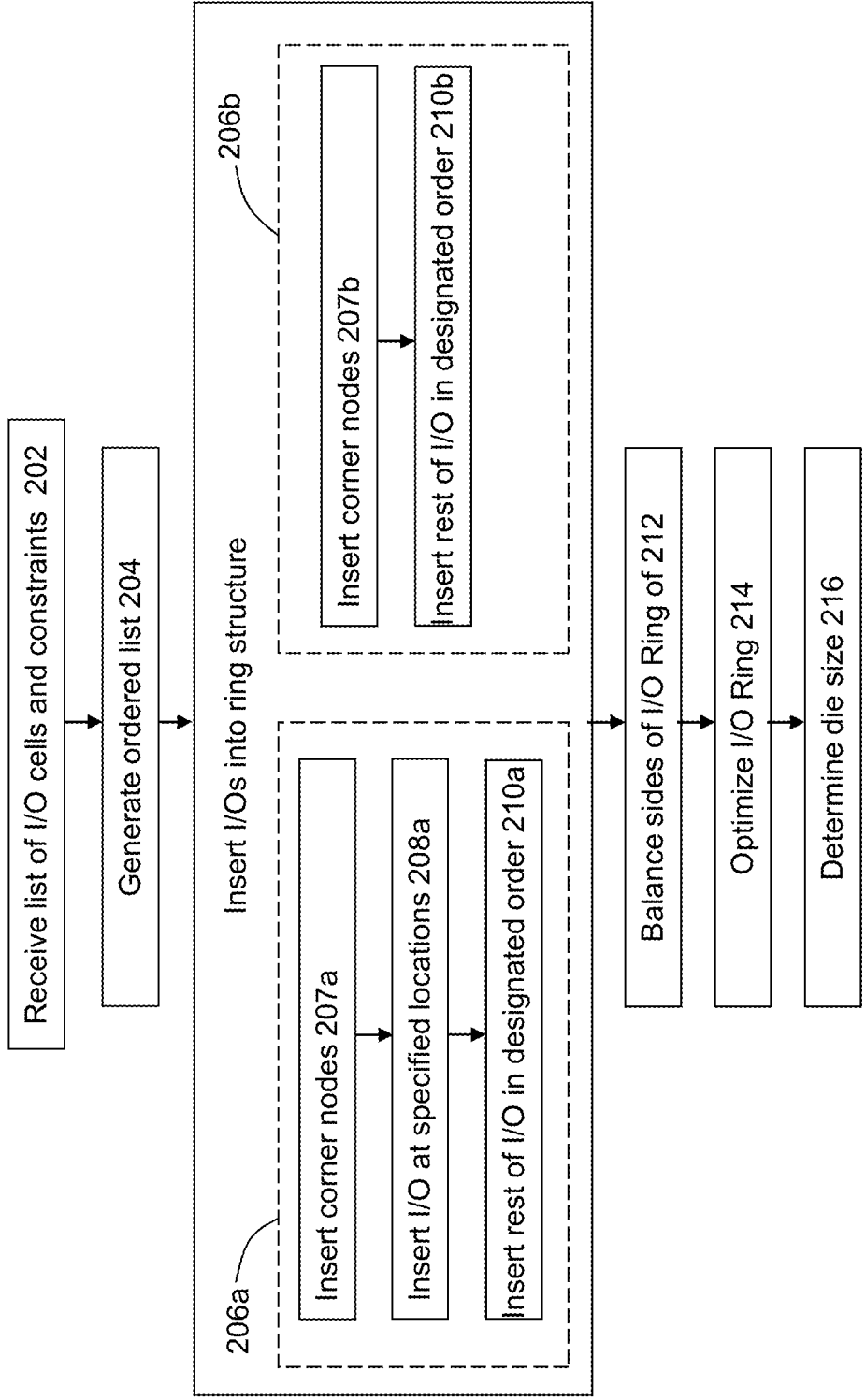

Fig. 3

| NAME | COLOR | QUANTITY | POWER/ GROUND | WIDTH | HEIGHT | SIDE |
|---|---|---|---|---|---|---|
| 300 |  | 6 | 2 | (60, 60) | (350, 60) |  |
| 302 |  | 1 | 0 | (2000, 700) | (700, 2000) | Left |
| 304 |  | 5 | 0 | (60, 60) | (320, 320) |  |
| 306 |  | 10 | 2 | (80, 80) | (80, 80) |  |
| 322 |  | 3 | 0 | (700, 1500) | (1500, 700) | Bottom |
| 320 |  | 10 | 2 | (60, 60) | (200, 200) |  |
| 318 |  | 5 | 0 | (60, 60) | (80, 80) |  |
| 316 |  | 3 | 0 | (300, 150) | (150, 3000) | Right |
| 312 |  | 4 | 2 | (50, 50) | (100, 100) |  |
| 308 |  | 4 | 0 | (350, 3500) | (400, 400) | Top |
| 310 |  | 10 | 4 | (70, 70) | (320, 320) |  |
| 324 |  | 10 | 4 | (60, 60) | (1000, 1000) |  |
| Power/ Ground |  |  |  |  |  |  |

Fig. 4B

| Must be on left side | Must be on top side | Must be on right side | Must be on bottom side | Order for rest of I/O |
|---|---|---|---|---|
| 302 | 308 | 316 | 322 | 300 |
|  |  |  |  | 304 |
|  |  |  |  | 306 |
|  |  |  |  | 310 |
|  |  |  |  | 312 |
|  |  |  |  | 318 |
|  |  |  |  | 320 |
|  |  |  |  | 324 |

METHOD AND SYSTEM FOR IMPLEMENTING A STRUCTURE TO IMPLEMENT I/O RINGS AND DIE AREA ESTIMATIONS

RELATED APPLICATIONS

The present application claims the benefit of U.S. Provisional application Ser. No. 61/323,292, filed on Apr. 12, 2010, which is hereby incorporated by reference in its entirety. The present application is related to U.S. application Ser. No. 12/978,279, entitled "METHOD AND SYSTEM FOR IMPLEMENTING I/O RINGS AND DIE AREA ESTIMATIONS" and U.S. application Ser. No. 12/978,328, entitled "METHOD AND SYSTEM FOR OPTIMIZING I/O RINGS", both of which are hereby incorporated by reference in their entirety.

BACKGROUND

Some embodiments of the invention are directed to an improved approach for implementing I/O rings and performing die size estimations.

A semiconductor integrated circuit (IC) has a large number of electronic components, such as transistors, logic gates, diodes, wires, etc., that are fabricated by forming layers of different materials and of different geometric shapes on various regions of a silicon wafer.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters.

The EDA tools may also be used to perform early stage analysis and examinations of an electronic design. For example, the process of performing chip planning can be greatly facilitated if the designer or chip planning tool can predict the expected die size of the IC product. However, the die size of the IC product is significantly affected by the required configuration of the I/O ring needed to support the IC product. The I/O ring is a top-level component within which all I/O related logic is instantiated, and is usually positioned around the periphery of the IC chip. Typical components include, for example, I/O cells, power and ground cells, boundary scan registers (BSRs), pin structures, and/or other glue-logic structures. The IC core typically resides within the boundaries of the I/O ring, with the core typically including the internal blocks and connectivity of the IC chip.

Since the I/O ring creates the peripheral boundary of the IC chip, this means that the amount of space available for the core is greatly affected by the size of the I/O ring, and hence the size of the die is also greatly affected by the required dimensions of the I/O ring. The size of the die for the IC product must be large enough to hold the required I/O ring structures as well as the core structures. Clearly, the most efficient die size is the situation when the dimensions of the minimum I/O ring periphery creates enough interior space to exactly match the required space of the core. If the total size of the periphery for the I/O ring is greater than what is needed to implement the core, the design is said to be "I/O limited". A design is "core limited" if the core requires more space than the minimum periphery required to implement the I/O ring.

Therefore, for planning purposes, it is very desirable for engineers and architects to be able to obtain an accurate estimate of the I/O ring configuration for the final IC product. One reason already presented is that accurate estimate of the I/O ring dimensions allows the engineer or architect to know the required die size for the product. Moreover, if the expected design is I/O limited, then the designer knows that there may be sufficient excess space in the design to include additional functionality within the core.

Conventionally, it has not been possible to obtain accurate estimate of the I/O ring configurations and die sizes at very early stages of a design process. One reason for this is because I/O rings are conventionally implemented much later in the design cycle, and hence have not been available in an accurate form at early stages of the design for chip planning or estimation purposes. Another reason is that I/O rings are typically constructed using a highly manually and complex process after much of the other portions of the design have already been implemented in detail.

SUMMARY

Embodiments of the present invention provide an improved method, system, and computer program product for implementing a structure to generate an I/O ring arrangement for an electronic design, and for performing chip planning and estimation based upon the I/O ring arrangement. A structure is maintained to implement the I/O Ring, where nodes in the ring data structure correspond to I/O cells in the I/O ring.

Other additional objects, features, and advantages of the invention are described in the detailed description, figures, and claims.

BRIEF DESCRIPTION OF FIGURES

FIGS. 1B-C illustrate example structures that can be employed for performing I/O implementation and die size estimation according to some embodiments of the invention.

FIG. 2 illustrates a flow of an approach for performing I/O implementation and die size estimation according to some embodiments of the invention.

FIG. 3 provides an illustrative example of a list of I/O cells to insert into an I/O ring.

FIGS. 4B and 4C illustrate example orderings for I/O cells.

DETAILED DESCRIPTION

Embodiments of the present invention provide an improved method, system, and computer program product for generating an I/O ring arrangement for an electronic design, and for performing chip planning and estimation based upon the I/O ring arrangement.

Figure 1A:
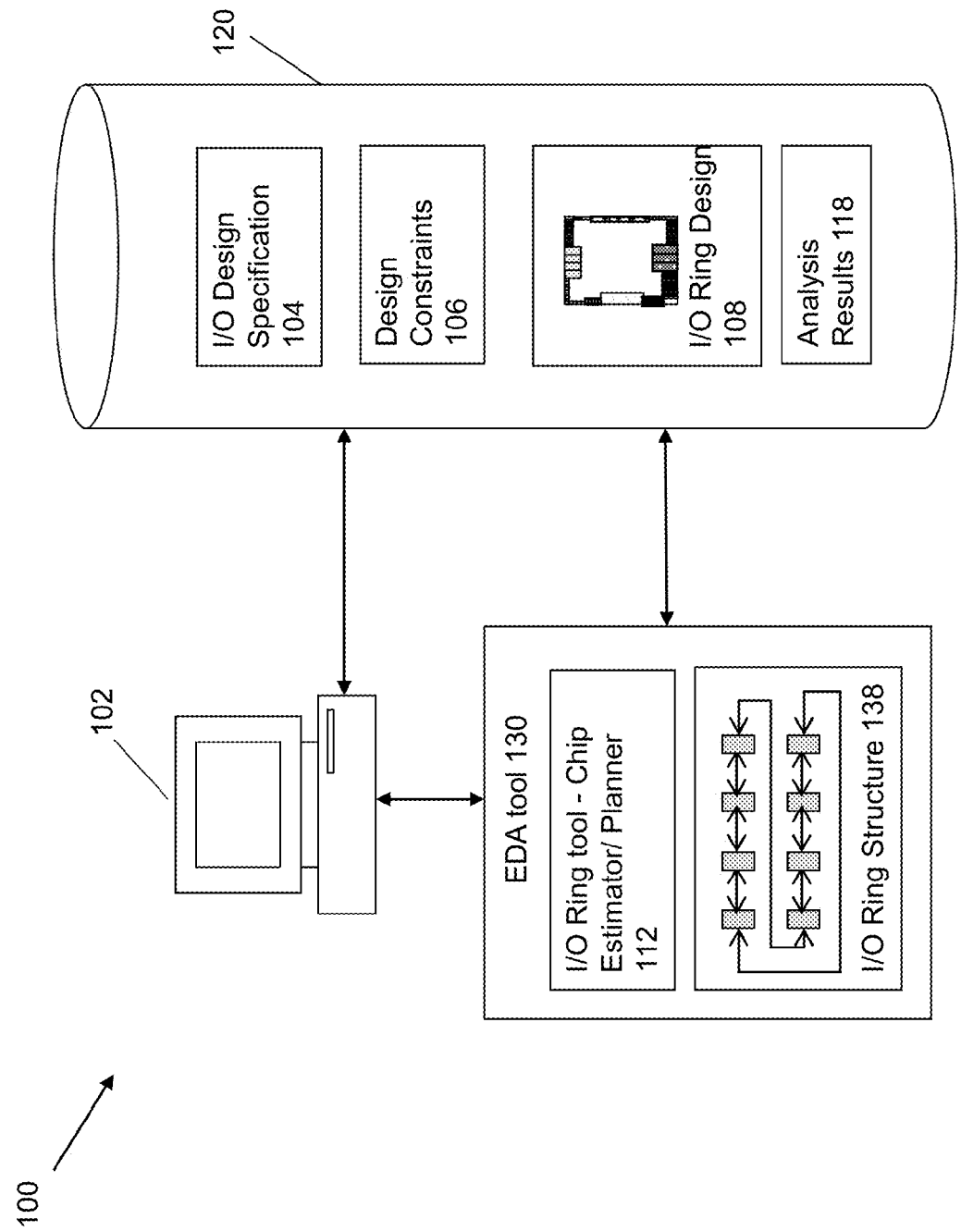
FIG. 1A depicts an architecture of a system for performing I/O implementation and die size estimation according to some embodiments of the invention.

FIG. 1A shows an architecture of a system 100 for implementing I/O ring designs 108 according to some embodiments of the invention. System 100 may include one or more users at one or more user stations 102 that operate the system 100 to design, edit, and/or plan electronic designs. The users at user station 102 correspond to any individual, organization, or other entity that uses system 100 for planning or designing an electronic design. Such users include, for example, chip architects, product designers, design engineers, and/or verification engineers. User station 102 comprises any type of computing station that may be used to operate, interface with, or implement EDA tools, applications or devices 130. Examples of such user stations 102 include for example, workstations, personal computers, or remote computing terminals. User station 102 comprises a display device, such as a display monitor, for displaying electronic design layouts and processing results to users at the user station 102. User station 102 also comprises one or more input devices for the user to provide operational control over the activities of system 100, such as a mouse or keyboard to manipulate a pointing object in a graphical user interface.

The user station 102 may be associated with one or more computer readable mediums or storage devices 120 that hold data regarding the user's electronic design 108, design specifications 104 and/or constraints 106 relating to the proposed electronic design. Computer readable storage device 120 comprises any combination of hardware and software that allows for ready access to the data that is located at the computer readable storage device 120. For example, computer readable storage device 120 could be implemented as computer memory operatively managed by an operating system. The computer readable storage device 120 could also be implemented as an electronic database system having storage on persistent and/or non-persistent storage.

The one or more specifications 104 comprise any set of information or parameters that the user has developed for information relating to the I/O ring. The specification 104 includes the list of components that should be included within the I/O ring, such as I/O cells, power and ground cells, boundary scan registers (BSRs), pin structures, and/or other gluelogic structures.

One or more I/O ring design constraints 106 may also be stored in database 120. The design constraints comprise additional specifications for the I/O ring that control the allowable configurations for the I/O ring design 108.

The specification 104 and design constraints 106 may include some or all of the following items of information according to some embodiments of the invention:

Target Aspect Ratio: This information identifies the expected aspect ratio for the IC product. The aspect ratio is defined in some implementations as the Height divided by the Width of the IC product.

I/O Placement: This information identifies the expected placement locations for certain items within the I/O ring. The user or design may need to place certain I/O cells at particular locations within the I/O ring, e.g., to place certain memory-related I/O cells at the left side of the I/O ring.

I/O Proximity: This information identifies when certain I/O components must be placed near other I/O components. The reason for this constraint is to ensure that I/O cells having the same functionality are placed together in the I/O ring.

I/O Ordering: This information identifies the order in which I/O cells and/or components need to be placed within the I/O ring. One reasons for specifying an order for the I/O components is to control the proximity of certain sets or segments of I/O cells relative to other sets or segments of I/O cells.

Corner packing: This information identifies whether the I/O ring should include I/O cells in the corners. For a typical wirebond design, it is likely that I/O cells will not be placed into the corners of the I/O ring, since conventional technologies do not allow the corners to be bonded to the bond pads. Therefore, the wirebond design will typically turn off corner packing and include nonfunctional corner cells in the corners. However, the designer of a flip-chip implementation may choose to allow I/O cells to be packed in the corners of the I/O ring, and therefore may chose to turn on corner packing for the I/O ring design to reduce the size of the die.

Stacking: This information identifies whether I/O cells can be stacked at the ring periphery. This is an option that can be taken to reduce die size, at the expense of possibly increasing package costs by requiring one or more additional re-distribution layers.

Rotation restrictions: This information identifies the limitations placed on certain I/O components when placed at certain locations or sides on the I/O ring, particularly with respect to whether a given I/O cell can be rotated.

Size of core: This information provides sufficient data to understand the space requirements for the core. The reason for this information is because the I/O ring must be sufficiently large to provide enough space for the core components.

In operation, the user at user station 102 provides an I/O ring tool 112 with a specification 104 that includes a list of the I/O cells/components to be placed in the I/O ring 108. The user will also include a set of constraints 106 for the I/O ring 108. The I/O ring tool 112 will use the specification 104 and design constraints 106 to automatically populate an I/O ring data structure 138 which represents the expected design of the I/O ring 108. The user can then perform analysis upon the I/O ring design 108. For example, for chip planning purposes, die size estimation can be performed once the I/O ring design 108 has been generated. In addition to chip planning, the I/O ring design 108 can be used for prototyping purposes. Moreover, the I/O ring design 108 can be passed to downstream design tools to help construct the actual I/O ring for the IC product. Analysis results 118 may be stored in the compute readable storage medium 120 or displayed on a display device at user station 102.

Figure 1B:
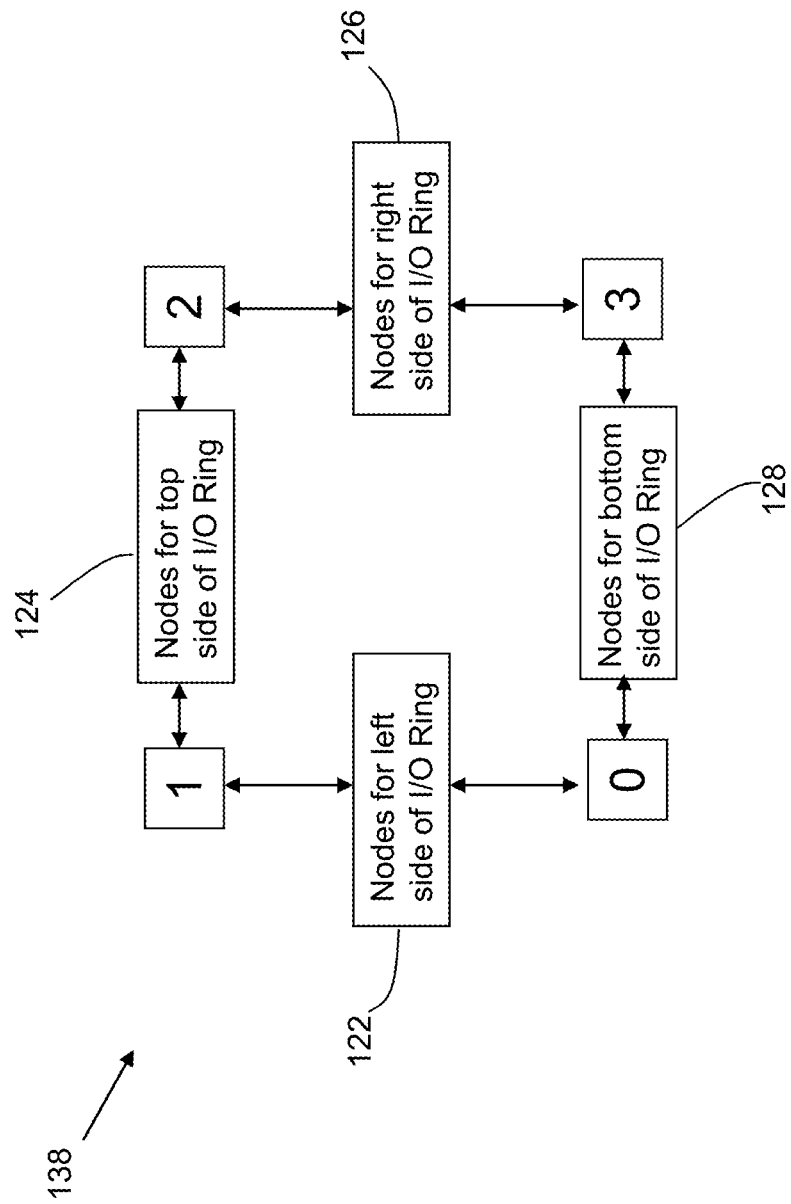

FIG. 1B illustrates an example structure 138 that can be used to implement embodiments of the invention. Essentially, structure 138 is populated by the I/O ring tool 112 to generate the I/O ring design 108. Structure 138 comprises a circularly linked list of nodes, where each node represents a separate components or element of the I/O ring. The structure is a doubly-linked list, since each node in the structure 138 is linked to both its adjacent forward and backwards neighbors.

There are four special corner nodes in the structure 138, which are marked in the figure as nodes 0, 1, 2, and 3. According to one embodiment, corner node 0 represents the lower left corner position of the I/O ring, corner node 1 represents the upper left corner position of the I/O ring, corner node 2 represents the upper right corner position of the I/O ring, and corner node 2 represents the lower right corner position of the I/O ring. Of course, the number of corner nodes is dependent upon the particular die shape that is being implemented, where there are four corner nodes for a rectangular-shaped die.

Between each of the corner nodes are the nodes that correspond to the I/O components that are placed into the I/O ring. The nodes 122 that are placed on the left side of the I/O ring are positioned between corner node 0 and corner node 1. The nodes 124 that are placed on the top side of the I/O ring are positioned between corner node 1 and corner node 2. The nodes 126 that are placed on the right side of the I/O ring are positioned between corner node 2 and corner node 3. The nodes 128 that are placed on the bottom side of the I/O ring are positioned between corner node 3 and corner node 0.

For ease of illustration and explanation, FIG. 1B only displays a single box 122, 124, 126, 128 to represent the nodes that exist for each side of the I/O ring. It is noted that in actual implementation, it is likely that there will be numerous I/O cells along each side of the I/O ring, and hence numerous individual nodes that exists between each of the corner nodes.

Even if each separate I/O component is normally represented by its own node in structure 138, there may be circumstances in which it is desirable to group multiple nodes together to be represented by a smaller number of nodes. For example, structure 138 may be configured to collapse multiple similar nodes into a single representative node for memory management purposes. With this option, the single node can be more easily handled instead of handling multiple individual nodes, particularly for operations that need to be commonly and collectively executed for the multiple nodes. The single representative node can include pointers to the individual nodes in case the detailed information for the individual nodes is needed.

Any suitable structure can be used to represent the nodes in structure 138. FIG. 1C shows an example node structure 150 that can be used in some embodiments of the invention. The node structure 150 includes a node identifier, as well as an I/O name, color and/or type. This information is to identify the type of the I/O component corresponding to the node. The color parameter is used for display purposes for a user interface, so that each cell type can be visually distinguished from another cell type. Therefore, in some embodiment, the color parameter is not necessarily used in an algorithm to actually implement the I/O ring.

The height and width information specifies the size of the I/O component. It is possible that the I/O component corresponds to different sizes when it is located at different sides of the I/O ring. Therefore, the height and width information can be constructed to have alternate values depending upon the specific side to which the component is placed. For example, the syntax "(A,B)" could be used to specify that the component has the "A" value when it is placed on the left and right sides of the I/O ring, but has the "B" value when placed on the top or bottom sides. For the purposes of explanation, the term "width" refers to the length of the I/O cell or component along the periphery of the I/O ring, and the term "height" refers to distance that the component extends inwards within the die.

The node may also include information about a particular side of the die upon which the I/O component must be placed. For example, this "side" parameter can be implemented as an integer value, where a value of "0" indicates that the component must be located along the left side, a value of "1" indicates that the component must be located along the top side, a value of "2" indicates that the component must be located along the right side, and a value of "3" indicates that the component must be located along the bottom side.

The combination of the "side", "height", and "width" parameters can therefore be used to obtain the actual width and height of a component in the I/O ring. Since the width and height parameters are dual-values that are specific to a particular side of the die, the value of the "side" parameter may be needed if the dual width/height values are different. Of course, if the dual width/height values are the same, this means that the component size can be determined without regard to the particular side upon which it is placed.

The node may also include information about whether the component is a stackable component, e.g., whether the component is designated as being eligible for stacking. Depending upon the type of I/O component being represented, it is possible that the component is of a type that should never be stacked. According to some embodiment, the default setting for a component is to make it non-stacking, and explicit user action must be taken to set the component to be stackable.

Assuming that a component is stacked, then the node will include a representation of the component being stacked. According to some embodiments, nodes may be tiled together to indicate stacking of components, where the tiled nodes will identified as such along with information regarding which of the tiled nodes are along the periphery and which are within the interior of the die. Tile width and tile height parameters may be employed to track this type of information, where the tile width parameter identifies the tiling (or stacking) that occurs along the width (or edge) of the die. The tile height parameter identifies the tiling that occurs into the core of the die. The total stacking is based upon the tile width times the tile height parameters. For example, if there are six I/O cells to place, and the cells are stacked such that three are along the edge and the stacking extends two cells deep into the core, then the tile width parameter is "3" and the tile height parameter is "2", where 3 (tile width value) times 2 (tile height value) equals 6, which is then total number of cells being stacked. The total width and height of the stacked cells is calculated by looking at the tile width and tile height values. Multiplied by the individual width and height values for each cell according to the particular side upon which they are placed. According to another embodiment, stacked nodes are represented by a linked chain of nodes to indicate stacking and stack position.

The node representation 150 will also include pointers to point to the next and previous nodes in the linked list.

FIG. 2 shows a flow of a process for implementing I/O designs and die estimation according to some embodiments of the invention. At 202, the specification and constraint information for the I/O ring are received by the EDA tool. In some embodiment, a list of I/O cells is received for placement into the I/O ring. In addition, constraints are received or designated for the I/O ring. For example, an aspect ratio may be received or specified for the I/O ring at 202.

At 204, an initial list of I/O cells is initialized for the I/O ring. According to some embodiments, a specified ordering is imposed on the list of I/O cells at this point. The ordering may be specified by the user or automatically determined by the EDA tool.

In addition, the list of I/O cells may be analyzed to identify the power and ground components that should be included in the I/O ring. This action identifies the number of power and ground cells that should be inserted into the I/O ring, as well as location of these cells within the ring structure. According to some embodiments, the number of power and ground cells to place into the I/O ring is a function of the power expected to be consumed by the IC product. The total expected power is divided by the capabilities of each individual power/ground pad to approximately identify the expected number of power and ground pads. These power and ground pads are then spread among the I/O cells to be placed into the I/O ring. One consideration for determining where to insert the power and ground components into the I/O ring is to determine whether there are I/O cells having height and width dimensions that generally match the dimensions of I/O cells being placed into I/O ring, so that the basic footprint of the power/ground cells generally match the footprint of adjacent I/O cells.

The nodes corresponding to the I/O components are added to the ring data structure at 206. According to some embodiments, the approach that is taken to populate the ring structure may be different depending upon whether all nodes are ordered, or if only certain nodes are ordered. One approach is to order only the nodes that are not pre-assigned to a given side of the I/O ring. In this approach, the ring structure is populated as shown in 206a, where the corner nodes are first added at 207a, followed by insertion of nodes at appropriate locations between the corner nodes at 208a for components which must be placed at certain locations or sides of the I/O ring. Next, at 210a, the nodes for the rest of the I/O components are inserted in the specified order into the ring data structure. According to one embodiment, this initial placement action is taken by inserting the nodes along a single side of the I/O ring, e.g., by inserting the nodes between the two corner nodes for a designated side for the I/O ring. For example, the nodes can be initially inserted in order along the bottom side of the I/O ring by inserting between corner node 3 and corner node 0.

In an alternate approach, all nodes are ordered ahead of time, including nodes for cells that are pre-assigned to a given side of the I/O ring. In this approach, the ordering will account for the side at which certain nodes must be placed. As shown in 206b, the corner nodes are first added at 207b, but the next action at 210b is to insert all of the nodes for the rest of the I/O components in the specified order into the ring data structure. As before, this initial placement action is taken by inserting the nodes along a single side of the I/O ring, e.g., by inserting the nodes between the two corner nodes for a designated side for the I/O ring. For example, the nodes can be initially inserted in order along the bottom side of the I/O ring by inserting between corner node 3 and corner node 0.

At this point, since the bulk of the nodes are placed along a single side of the I/O ring, the ring is likely to have severely unbalanced side lengths. Balancing of the sides will occur at 212 to generally create desired side lengths. According to one embodiment, this action is accomplished by shifting each of the corner nodes within the ring data structure to achieve side lengths for the I/O ring that generally approximate the target aspect ratio that was provided as part of the constraints for the ring design. For the components from 208 which must be placed along certain sides of the I/O ring, the nodes for these components are corresponding shifted if a corner node shift will potentially affect its side position. It is noted that a corner node can never shift past another corner node in this embodiment.

According to some embodiments, "deficit" based pushing is employed to shift the corner nodes. According to this approach, a determination is made of the sides that have excess nodes/width lengths. The width information is used to determine side lengths for each node in the ring structure, taking into account any variations based upon different width values that may exist for components when placed along different sides of the ring. The corner nodes are walked to shift nodes from the sides with excess width lengths to sides that have a deficit of width lengths. This walking of corner nodes continues until the target ratio is approximately reached. It is possible that one or more filler nodes will need to be inserted along one or more of the sides to balance the sides and to reach the target aspect ratio.

At 214, actions can be taken to further optimize the placement of I/O cells along the I/O ring. For example, one possible optimization is to tweak the positioning of nodes to reduce the amount of fill space along the periphery, particularly if the design is I/O limited such that the required core area is smaller than the area formed by the current I/O ring configuration. Under this circumstance, reducing the amount of fill can be implemented to allow the die size to also shrink, subject to keeping of sufficient space for the core.

Another possible optimization is to manipulate the corners to shrink the die size. For example, one way to accomplish this optimization is to place the larger I/O cells towards the middle of the sides, leaving the smaller I/O cells in the corners. Since corner cells will often be configured to match the height of adjacent cells, this optimization will allow the corner cells to be implemented with smaller dimensions.

For certain design configurations, such as flip-chip designs, corner packing can also be used to minimize the die size. With corner packing, the width and/or length of the corner cells is reduced to zero. From a data structure point of view, the corner cells would still exist. However, since the width and/or height of the corner cells have a zero value, the corner cells would not take up any space along the periphery. Therefore, the adjacent nodes would effectively be packed into the corner. The overall effect is that the die is smaller because the corner cells would no longer contribute to the die size.

Stacking can also be used to optimize the I/O ring. For stack-eligible components, stacking parameters can be configured to determine whether stacking will occur. For example, one way to implement stacking parameters is to configure the number of bumps into an interior at which stacking can occur, i.e., to determine how deep components can be stacked. The number of bumps into the interior from the edge is calculated based upon bump density, bump-to-bump distances, and the amount of real estate occupied by the stack-eligible components. Assuming the bump-based stacking parameters permit stacking, then components are stacked to remove components from the periphery of the I/O ring. This permits the size of the die to be reduced.

Once the I/O ring design has been completed, analysis can be performed at 216. For example, die size estimation can occur at 216 for chip planning purposes.

To illustrate embodiments of the invention, consider the example list of I/O components shown in FIG. 3 which is to be placed into an I/O ring. Each I/O component in this example corresponds to a name, a display attribute or color, quantity, power/ground node information, width, height, and side placement designation. The "name" attribute corresponds to an identifier for the node type. The "color" attribute corresponds to some sort of display attribute that allows the component to be readily identified when displayed on a user interface. For example, a unique color or display pattern can be assigned to each of the different types of components.

The "quantity" attribute identifies the number of components/cells of a given type need to be inserted into the I/O ring. The "Power/Ground" attribute corresponds to the number of power and ground components that need to be included with a given set of I/O cells/components. The number of power and ground components can be specified by a user or automatically calculated. According to one embodiment, the power and ground components are evenly dispersed within the group of components to which they are assigned.

As used herein, the term "segment" refers to the grouping of nodes corresponding to a given component type, which is determined by adding the quantity attribute to the number of power and ground attribute. For example, consider the components type 300 shown in FIG. 3. The designer only identified four cells of this type to be placed into the I/O ring. However, this grouping of cells also requires two power and ground components to be included. As a result, the total number of cells in the segment for component type 300 is six cells.

According to one embodiment, the segment is maintained as a unitary group of nodes which cannot be divided by or separated by another ordinary node. Therefore, one grouping of a given component type cannot be broken up by another component type in the I/O ring. This restriction allows the I/O proximity designations to be implemented for the I/O ring design.

However, it is possible that the designer will allow a grouping of the same type of components to wrap around a corner and be placed on multiple sides of the I/O ring. Therefore, the segment can be separated by a corner type node. According to one embodiment, this is the only type of node that can be used to separate a segment.

The width and height attributes identify the width length and height distance for the component type. For the purposes of explanation, the term "width" refers to the length of the I/O cell or component along the periphery of the I/O ring, and the term "height" refers to distance that the component extends inwards within the die.

As previously noted, it is possible that the I/O component corresponds to different sizes when it is located at different sides of the I/O ring. Therefore, the height and width information can be constructed to have alternate values depending upon the specific side to which the component is placed. The syntax "(A,B)" could be used to specify that the component has the "A" value when it is placed on the left and right sides of the I/O ring, but has the "B" value when placed on the top or bottom sides.

Rotation restrictions can be imposed by appropriately configuring the width and height attributes for the components. This is accomplished by making the width and height values to have reverse alternate values. For example, the width attribute for an example component 302 could be set to (2000, 700) indicating that the width value when the component is placed along the left or right sides of the ring is "2000" microns, but the width value when the component is placed along the top or bottom sides of the ring is "700" microns. The height attribute for the same component could be set with reverse values of (700, 2000) indicating that the height value when the component is placed along the left or right sides of the ring is "700", but the height value when the component is placed along the top or bottom sides of the ring is "2000".

The "side" attribute indicates whether a given component type is required to be placed along a specified side of the I/O ring. Here, the component type 302 is specified to be placed along the left side of the ring. The component type 322 is specified to be placed along the bottom side of the ring. The component type 316 is specified to be placed along the right side of the ring. The component type 308 is specified to be placed along the top side of the ring.

Figure 4A:
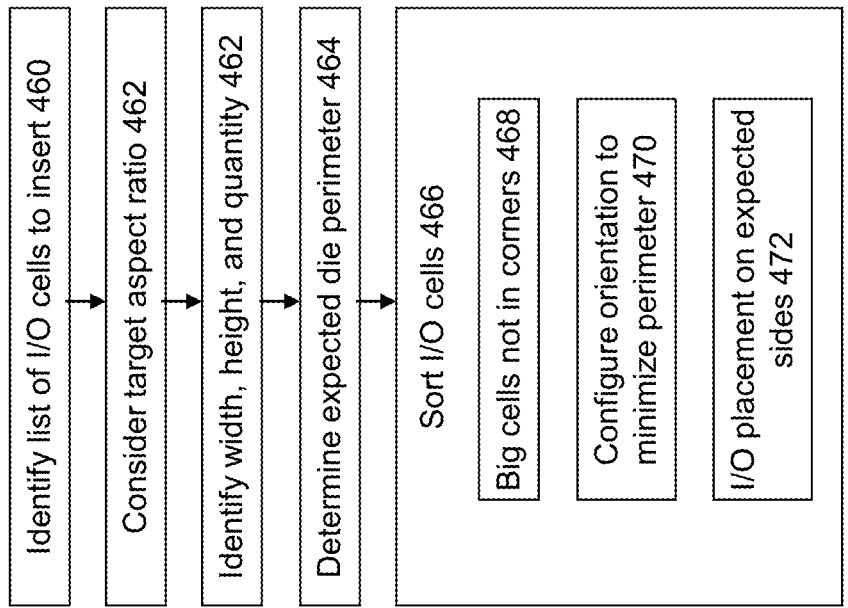
FIG. 4A illustrates a flow of an approach for ordering I/O cells according to some embodiments of the invention.

One initial action to implement the I/O ring having these I/O components is to create an ordering of the components for insertion into the I/O ring structure. FIG. 4A shows a flowchart of a process for ordering I/O components according to one embodiment of the invention. At 460, the process identifies the list of I/O components/cells to be inserted into the I/O ring, e.g., based upon a list as shown in FIG. 3. The target aspect ratio is considered at 462 in conjunction with the width, height, and quantity of each cell and power/ground component at 462. These values are used, at 464, to determine the expected die perimeter for the I/O ring when populated with all of the components.

Based upon these values, the I/O cells are sorted into an initial ordering at 466. The sorted list of I/O cells can be configured to pre-optimize or pre-select for certain qualities for the final I/O ring. For example, at 468, the ordering can be configured to minimize the chance that a larger I/O cell will be placed adjacent to or in a corner location. Since corner cells are often scaled to have similar height or width of its adjacent cell, die area minimization can be facilitated by making sure larger sized cells are not placed adjacent to the corner cells.

Since the cells may have different width and height values if placed along different sides of the die, at 470, the cell ordering can be sorted to minimize the chance that a cell is oriented with its longer dimension along the ring periphery. Therefore, the ordering is controlled to make sure the cell is oriented such that its smaller dimension is the width dimension and its larger dimension is the height dimension, if possible.

The ordering can also be controlled, at 472, such that cells are more likely to be placed along its assigned side of the I/O ring.

There are different approaches that can be taken to the cell ordering. One possible approach is to initially order every I/O cell, including the I/O cells that must be placed along specifically designated sides of the I/O ring. In this approach, the ordering must take into account the target aspect ratio to make sure that the expected placement of the I/O cells will occur at the correct side of the I/O ring. Another approach is to implement the cell ordering such that cells with a pre-assigned side are not ordered with the rest of the unassigned I/O cells. This allows the pre-assigned I/O cells to be inserted and re-ordered freely to ensure correct placement along a specified side of the I/O without concern of having to re-order the I/O cells.

FIG. 4B shows an initial ordering of the I/O cells from FIG. 3 to be placed into the I/O ring, where cells with a pre-assigned side are not ordered with the rest of the unassigned I/O cells. As previously noted, the component types 302, 308, 316, and 322 are identified as being associated with specified sides of the I/O ring. For the rest of the component types, the initial ordering in the example is specified as

300->304->306->310->312->318->320->324

Figure 4C:

FIG. 4C shows another example ordering of the I/O cells from FIG. 3 to be placed into the I/O ring, where all cells are ordered regardless of whether certain cells have a pre-assigned side of the I/O ring. In this example, the initial ordering is specified as

300->302->304->306->308->310->312->316->
318->320->322->324

FIGS. 5-14 illustrate the process of implementing the I/O rings based upon the ordering established in FIG. 4B. This example assumes that certain cells with pre-assigned sides (such as 302, 308, 316, and 322) are either not ordered or are able to be moved out-of-order.

Figure 5:
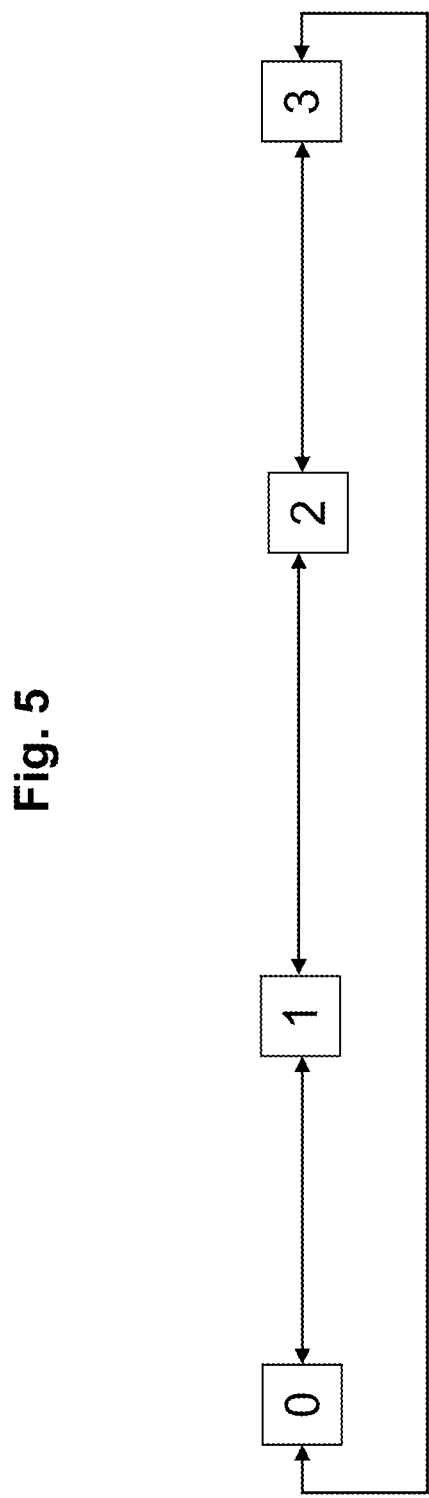
FIGS. 5-20 illustrate an example approaches for implementing an I/O ring according to some embodiments of the invention.

To implement the I/O ring design, nodes corresponding to each of the components are inserted into the ring structure. As shown in FIG. 5, the first step in populating the ring structure is to insert the corner nodes into the structure. Here, corner nodes 0, 1, 2, and 3 have been inserted into the structure, corresponding to the lower left corner, upper left corner, upper right corner, and lower right corner, respectively.

Figure 6:
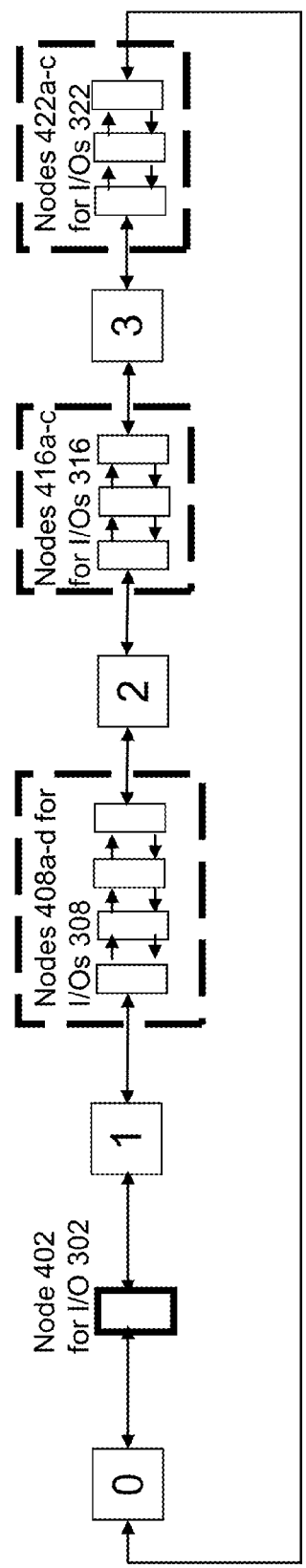

Next, as shown in FIG. 6, the nodes corresponding to components with pre-assigned sides are inserted into the ring structure. Recall that component type 302 is specified to be placed along the left side of the ring, and FIG. 3 indicates that only one component of this type is to be placed into the I/O ring. Therefore, a single node 402 corresponding to the one component of type 302 is inserted between corner node 0 and corner node 1. Four components of type 308 are to be placed along the top side of the ring. Therefore, four nodes 408a-d corresponding to four cells of type 308 are inserted between corner node 1 and corner node 2. Three components of type 316 are to be placed along the right side of the ring. Therefore, three nodes 416a-c corresponding to three cells of type 316 are inserted between corner node 2 and corner node 3. Finally, three components of type 322 are to be placed along the bottom side of the ring. Therefore, three nodes 422a-c corresponding to three cells of type 322 are inserted between corner node 3 and corner node 0.

Figure 7:
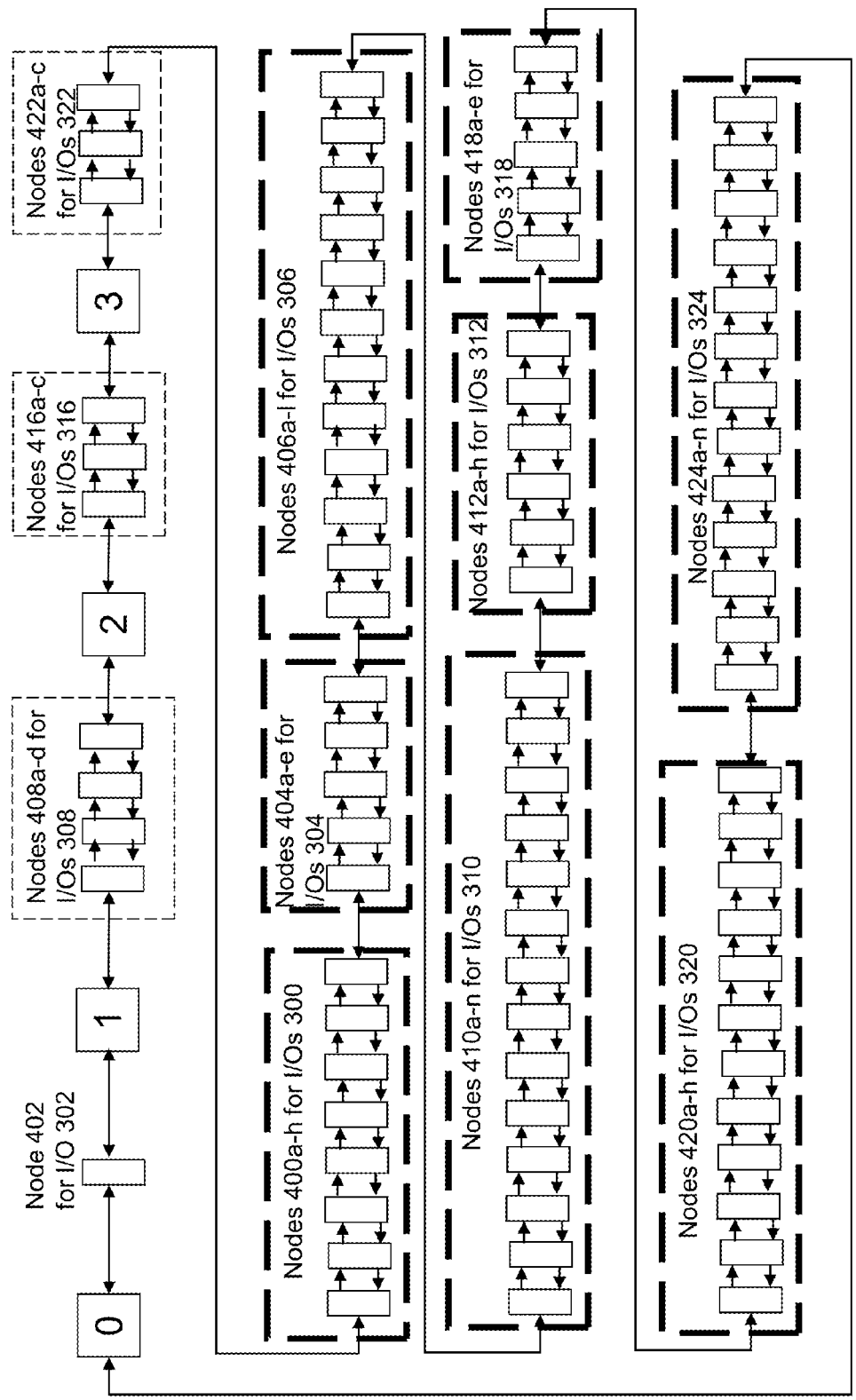

As shown in FIG. 7, nodes for the rest of the I/O cells are inserted into the ring structure in the order specified in FIG. 4. In this example, the nodes are inserted along the bottom side between corner node 3 and corner node 0. However, it can be appreciated that the nodes can be inserted into any side, so long as the desired ordering is maintained.

Here, nodes 400a-h are inserted which corresponds to a segment having six components of type 300 and two power and ground nodes (as specified in FIG. 3). Nodes 404a-e are inserted which corresponds to a segment having five components of type 304. Nodes 406a-l are inserted which corresponds to a segment having ten components of type 306 and two power and ground nodes. Nodes 410a-n are inserted which corresponds to a segment having ten components of type 310 and four power and ground nodes. Nodes 412a-h are inserted which corresponds to a segment having four components of type 312 and two power and ground nodes. Nodes 418a-e are inserted which corresponds to a segment having five components of type 318. Nodes 424a-n are inserted which corresponds to a segment having ten components of type 324 and four power and ground nodes.

Figure 8:
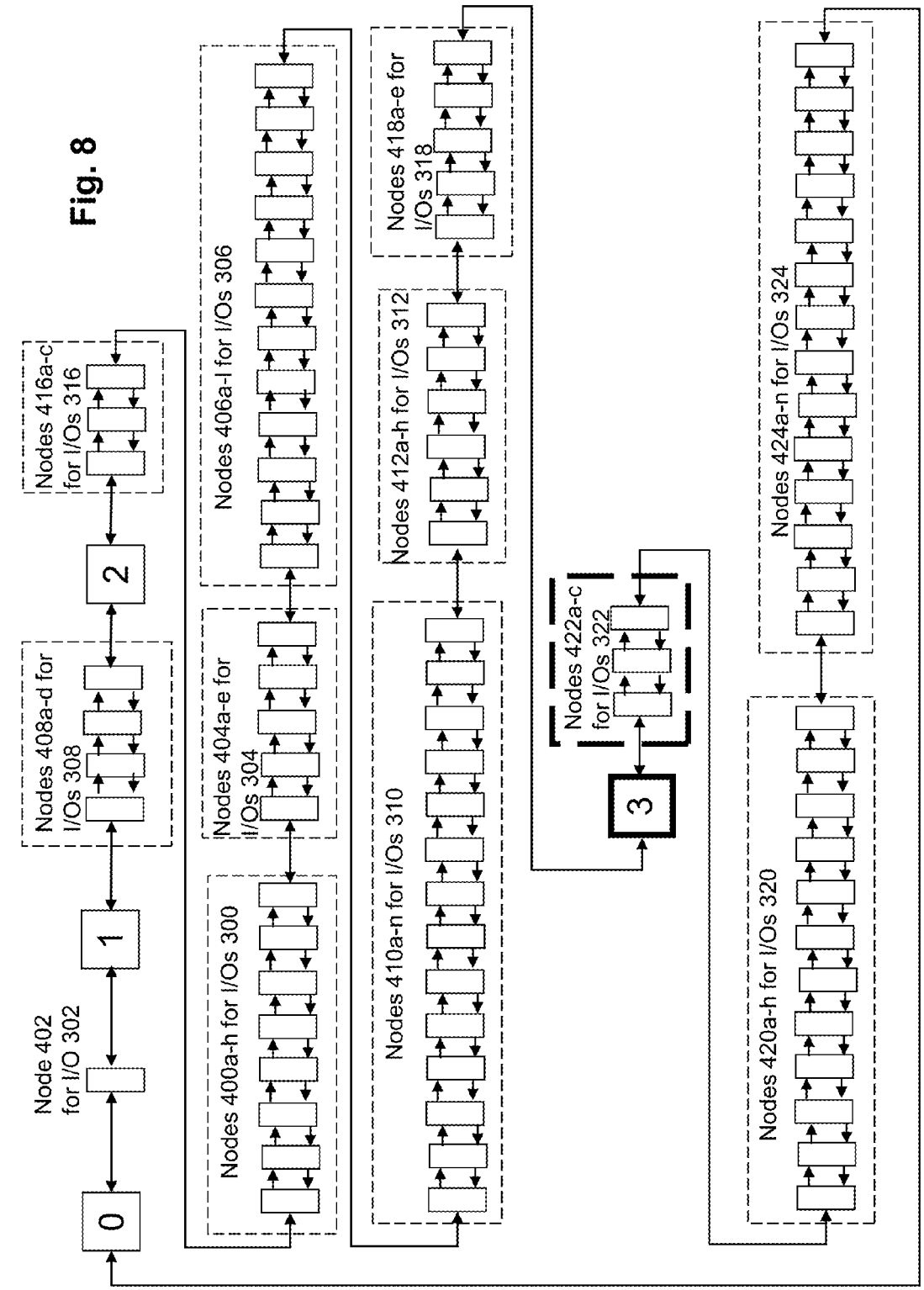

The corner nodes will now be shifted to attempt to balance the length of each side to match the desired aspect ratio. Any of the corner nodes can be moved to accomplish this. Since the in-balance in the dies is caused by the excess number of nodes between corner nodes 3 and 0, either corner 3 or corner 0 can be shifted at this time to remove some of the excess. For example, as shown in FIG. 8, corner node 3 can be shifted between the nodes 418a-e and nodes 420a-h.

It is noted that since the components of type 322 must remain on the bottom side of the I/O ring, nodes 422a-c must remain between corner nodes 3 and 0. Therefore, when corner node 3 was shifted as shown in the figure, nodes 422a-c must also shift positions to maintain their positions between corner nodes 3 and 0.

Figure 9:
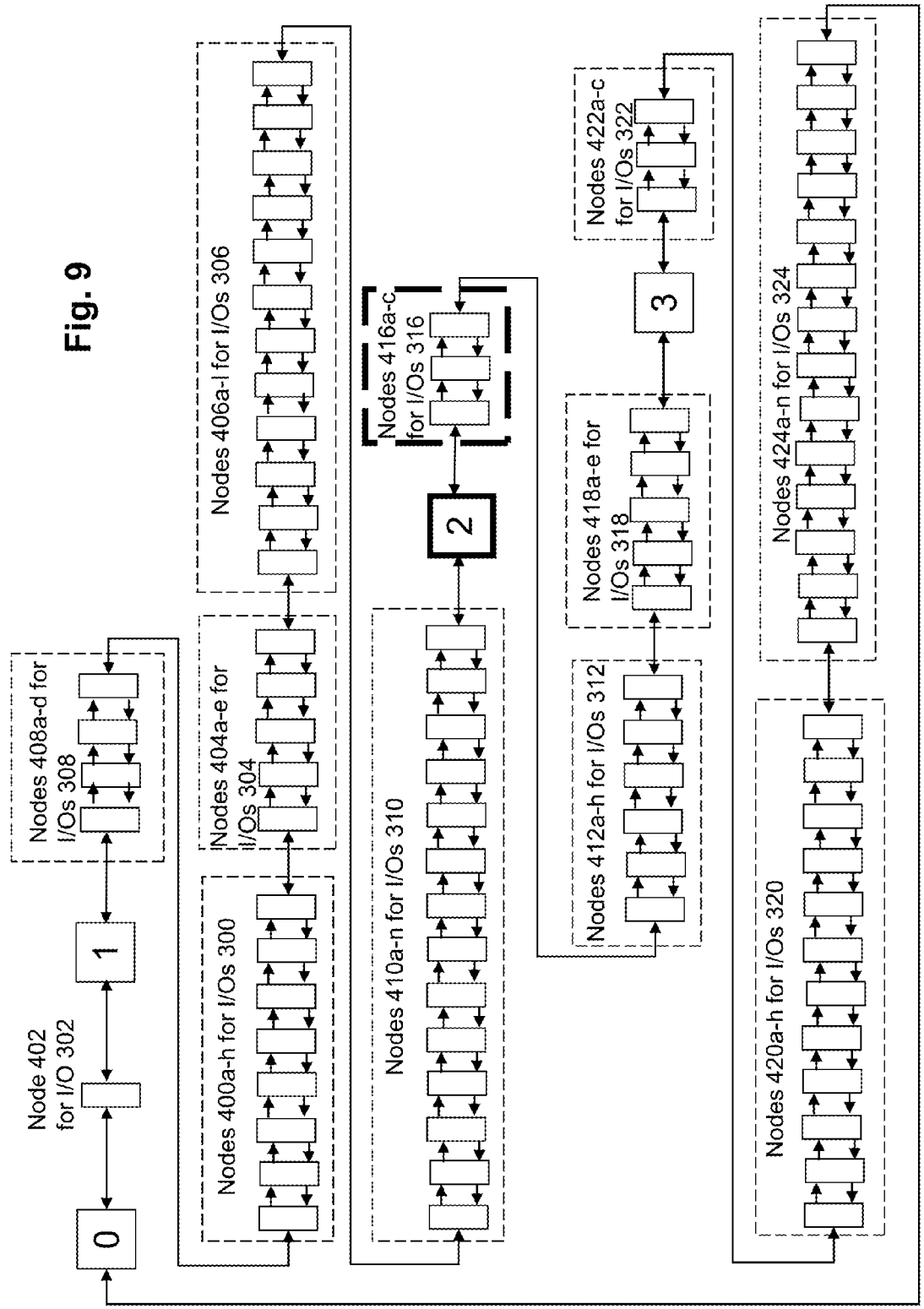

The corner nodes and any nodes corresponding to required side positions are shifted in a similar way until an approximation of the desired aspect ratio is achieved. As shown in FIG. 9, corner node 2 and nodes 416a-c can all be shifted between nodes 410a-n and nodes 412a-h.

Figure 10:
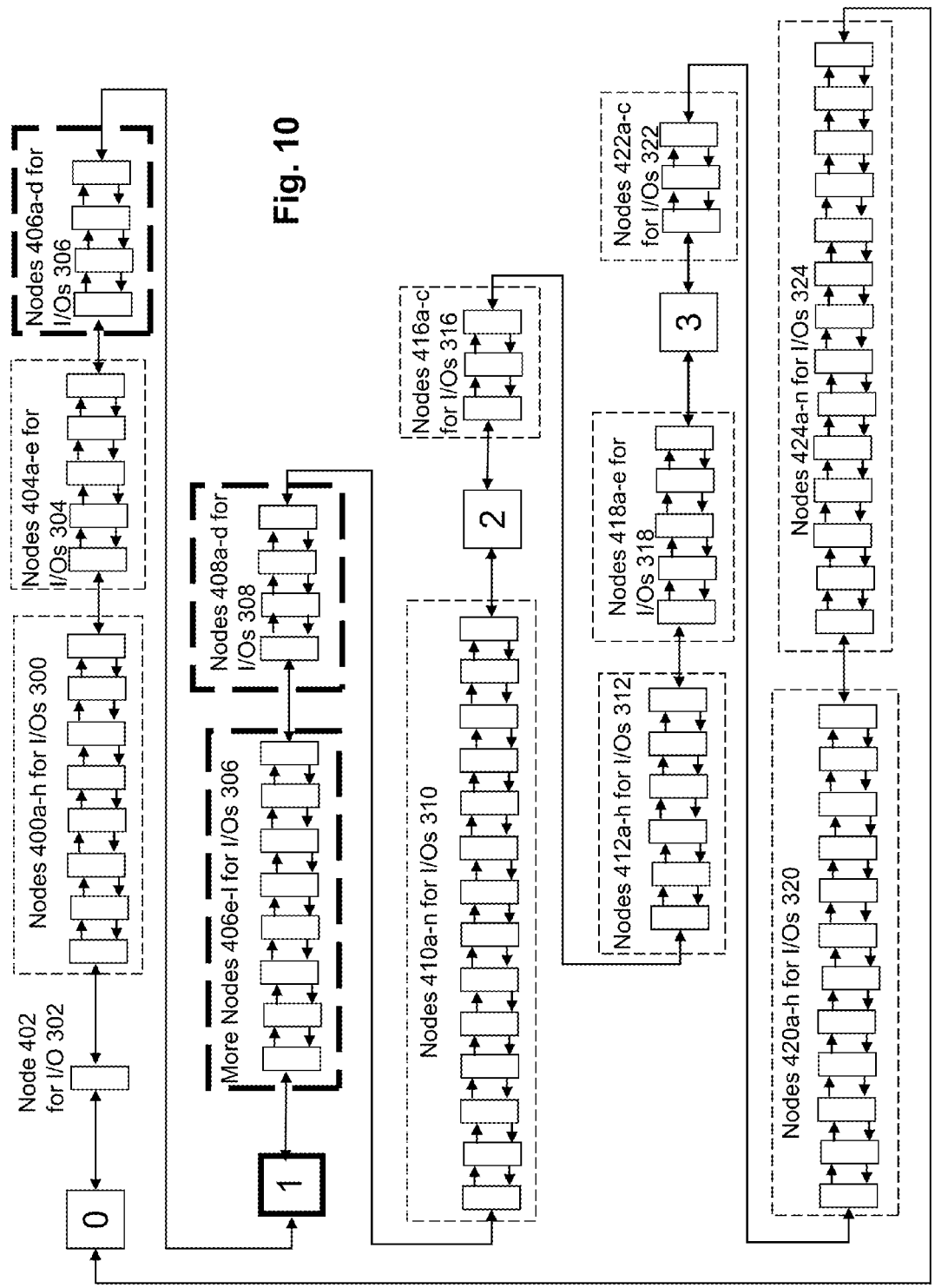

Shifting may occur that results in a segment being divided by a corner node. For example, FIG. 10 shows a situation where corner node 1 is shifted in a way that separates the nodes 406a-l into two groups of nodes, nodes 406a-d and nodes 406e-l. Nodes 406a-d now reside between corner nodes 0 and 1, indicating that the components corresponding to these nodes are placed on the left side of the I/O ring. Nodes 406e-l reside between corner nodes 1 and 2, indicating that the components corresponding to these nodes are placed on the top side of the I/O ring.

It is noted that nodes 408a-d shifted along with corner node 1, so that nodes 408a-d can maintain its position between corner nodes 1 and 2. However, these nodes also shifted entirely to the other side of nodes 406e-l. This is because one type of I/O cell cannot intersect and separate the components for another segment.

Figure 11:
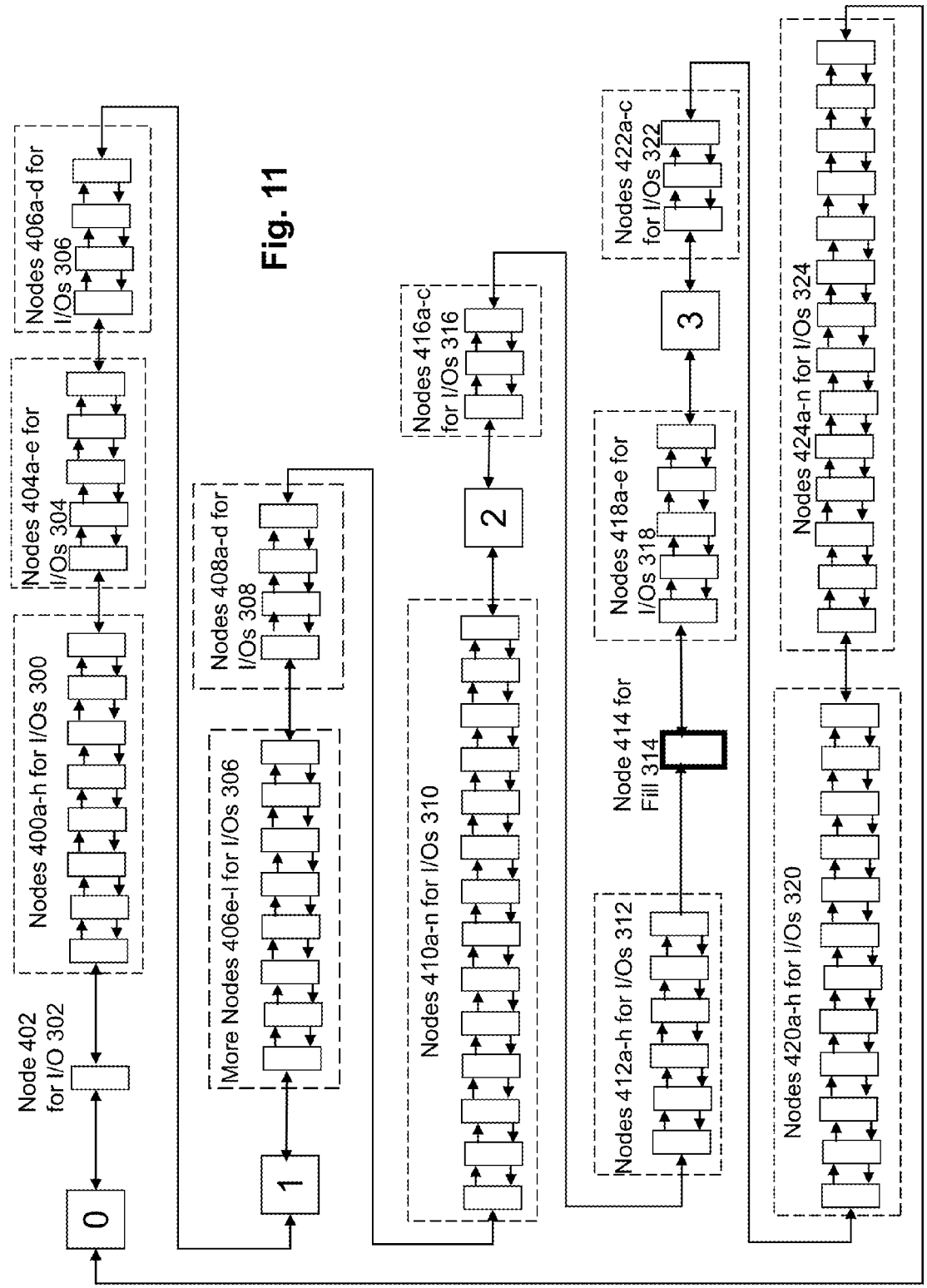

Next, to the extent required, one or more fillers can be placed into the ring structure. For example, as shown in FIG. 11, node 414 corresponding to fill structure 314 can be inserted between the segments for nodes 412a-h and nodes 418a-e.

Figure 12:
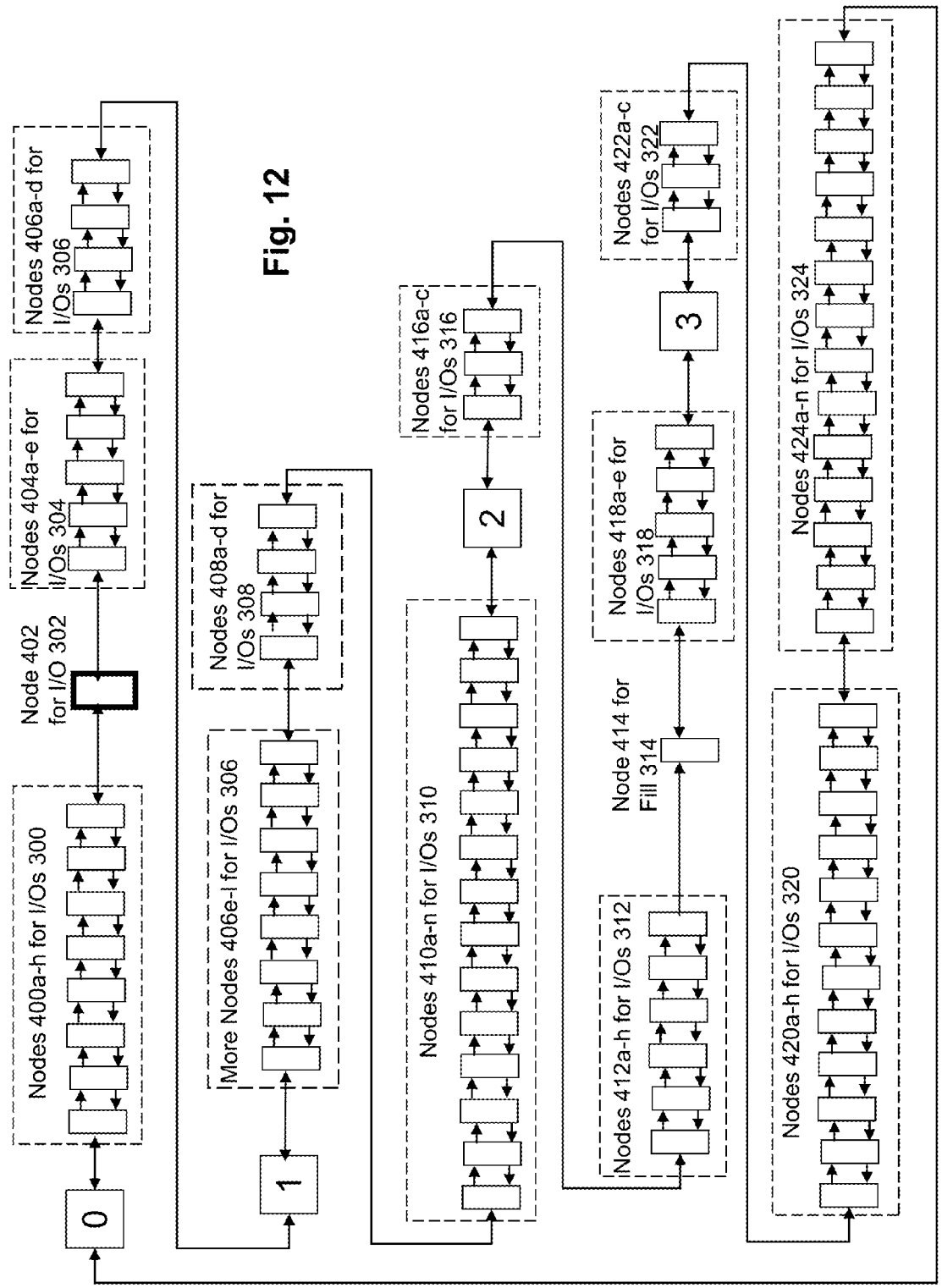
Figure 13:
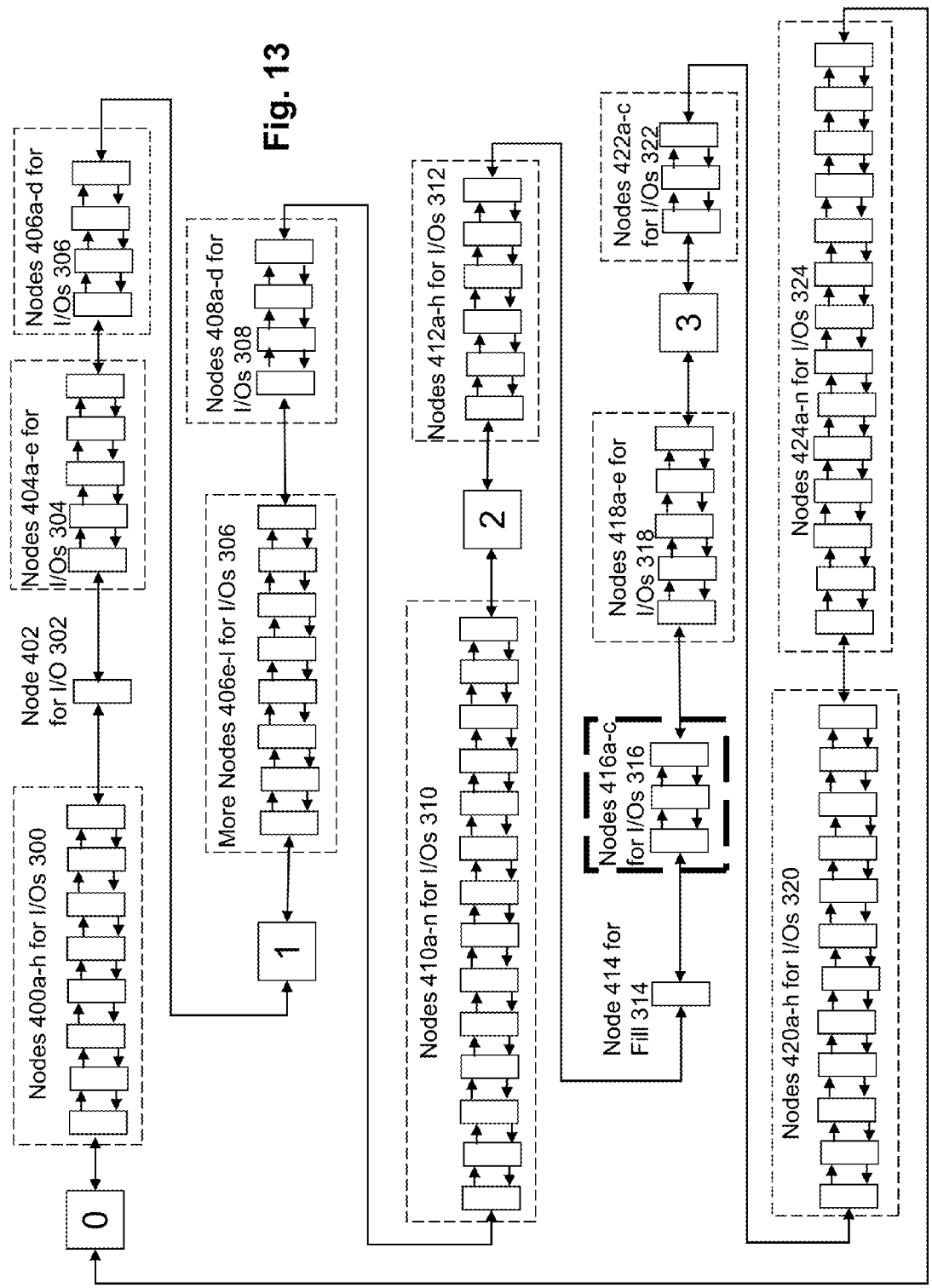
Figure 14:
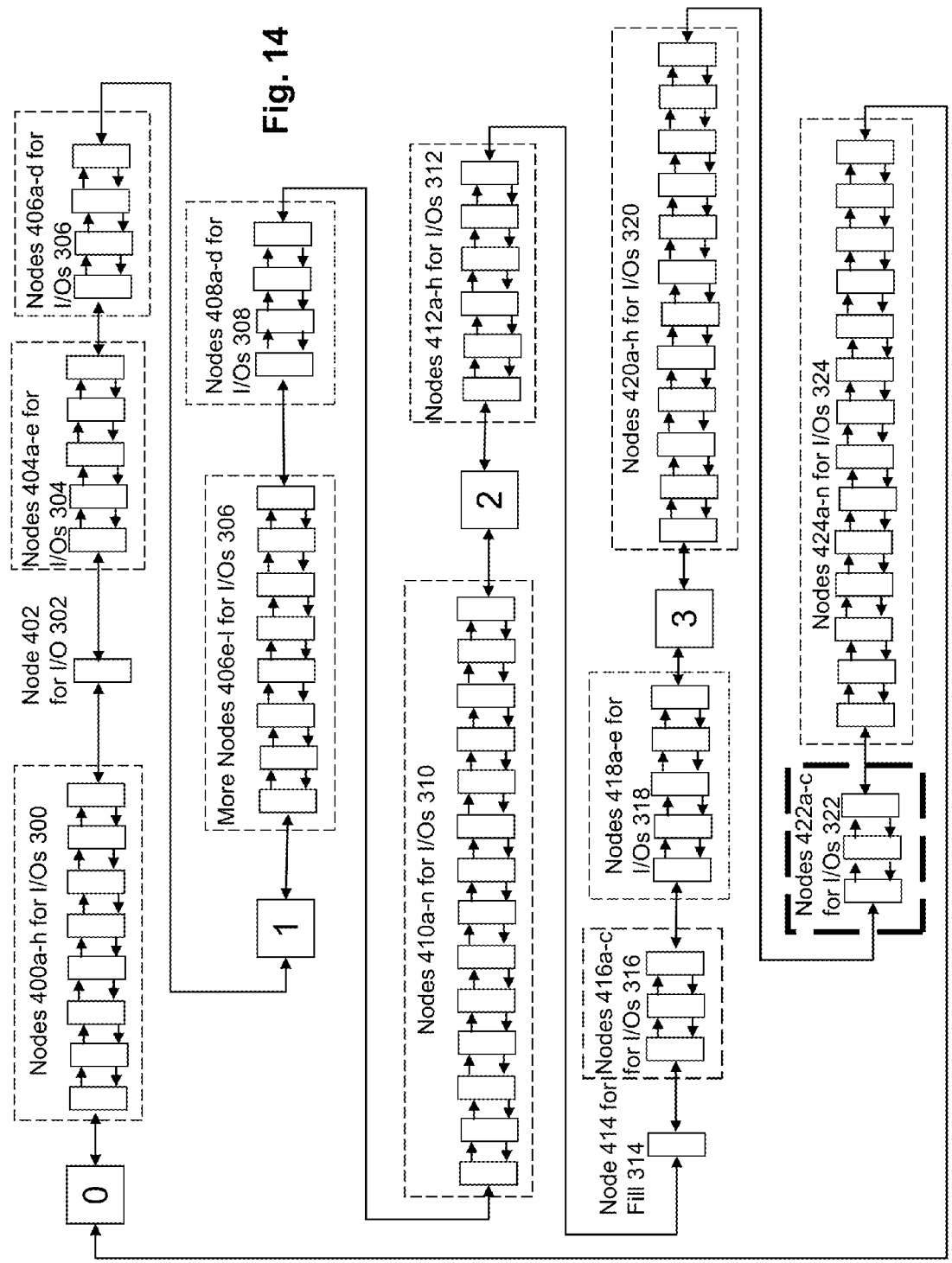

At this point, the desired aspect ratio has been generally achieved. Any of the above-described optimizations can now be implemented to further optimize the I/O ring configuration. For example, the larger-sized I/O cells can be shifted into the center of the sides to reduce the required size of the corner cells. As shown in FIG. 12, node 402 corresponding to a larger component size can be shifted in between smaller nodes 400a-h and 404a-e so that it is not placed at a corner location. Similarly, as shown in FIG. 13, nodes 416a-c corresponding to a larger component size can be shifted in between the fill node 414 and smaller nodes 418a-e. As shown in FIG. 14, nodes 422a-c corresponding to a larger component size can be shifted in between the smaller nodes 420a-h and 424a-n.

Figure 15:
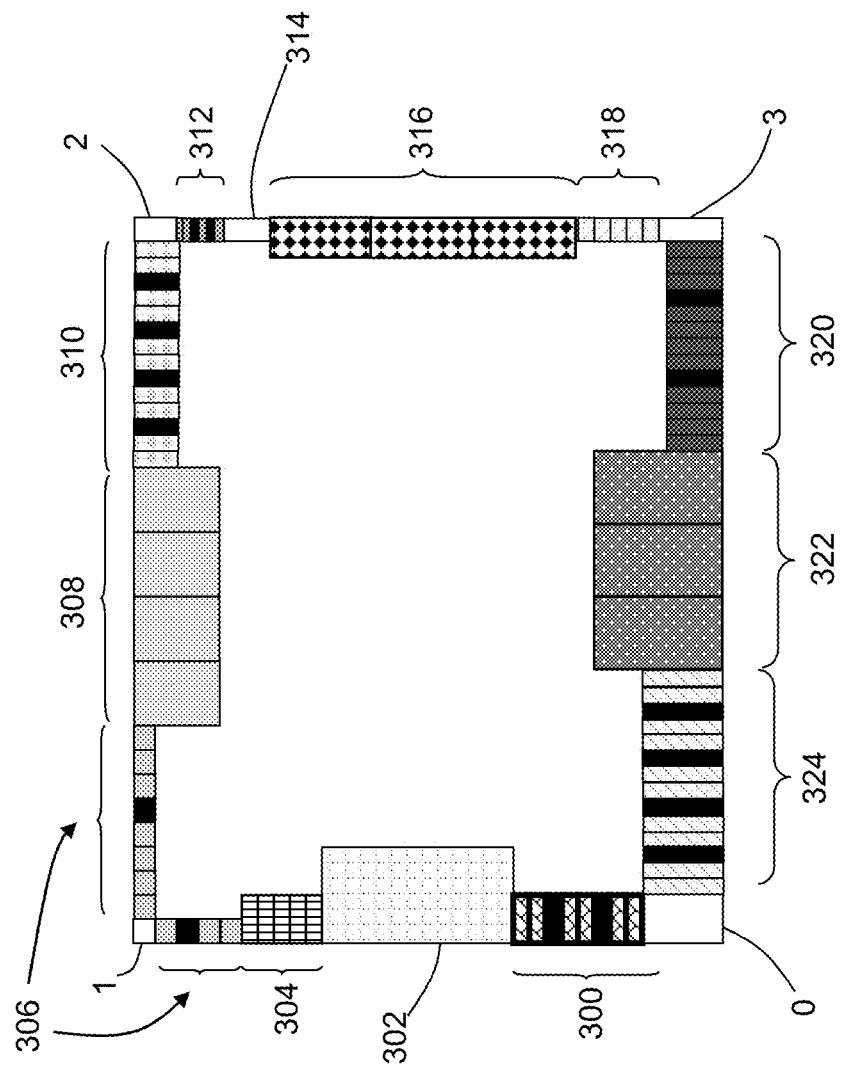

FIG. 15 shows the I/O ring that results from this process. Since the widths and heights are known for each of the I/O components, the dimensions of the various portions of the overall IC product can now be determined and analyzed. Therefore, the die size can be identified at this point for chip planning purposes. In addition, the core area can be checked to see there is sufficient space to include the core structures.

Figure 16:
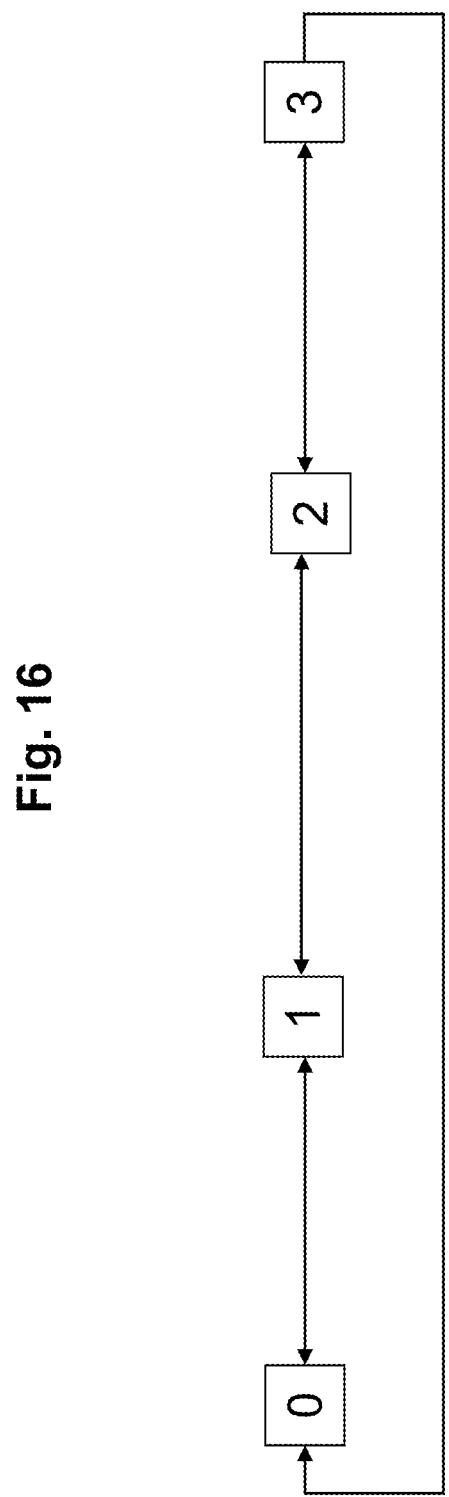

FIGS. 16-20 illustrate the process of implementing the I/O rings based upon the ordering established in FIG. 4C. As before, to implement the I/O ring design, nodes corresponding to each of the components are inserted into the ring structure. As shown in FIG. 16, the first step in populating the ring structure is to insert the corner nodes into the structure. Here, corner nodes 0, 1, 2, and 3 have been inserted into the structure, corresponding to the lower left corner, upper left corner, upper right corner, and lower right corner, respectively.

Figure 17:
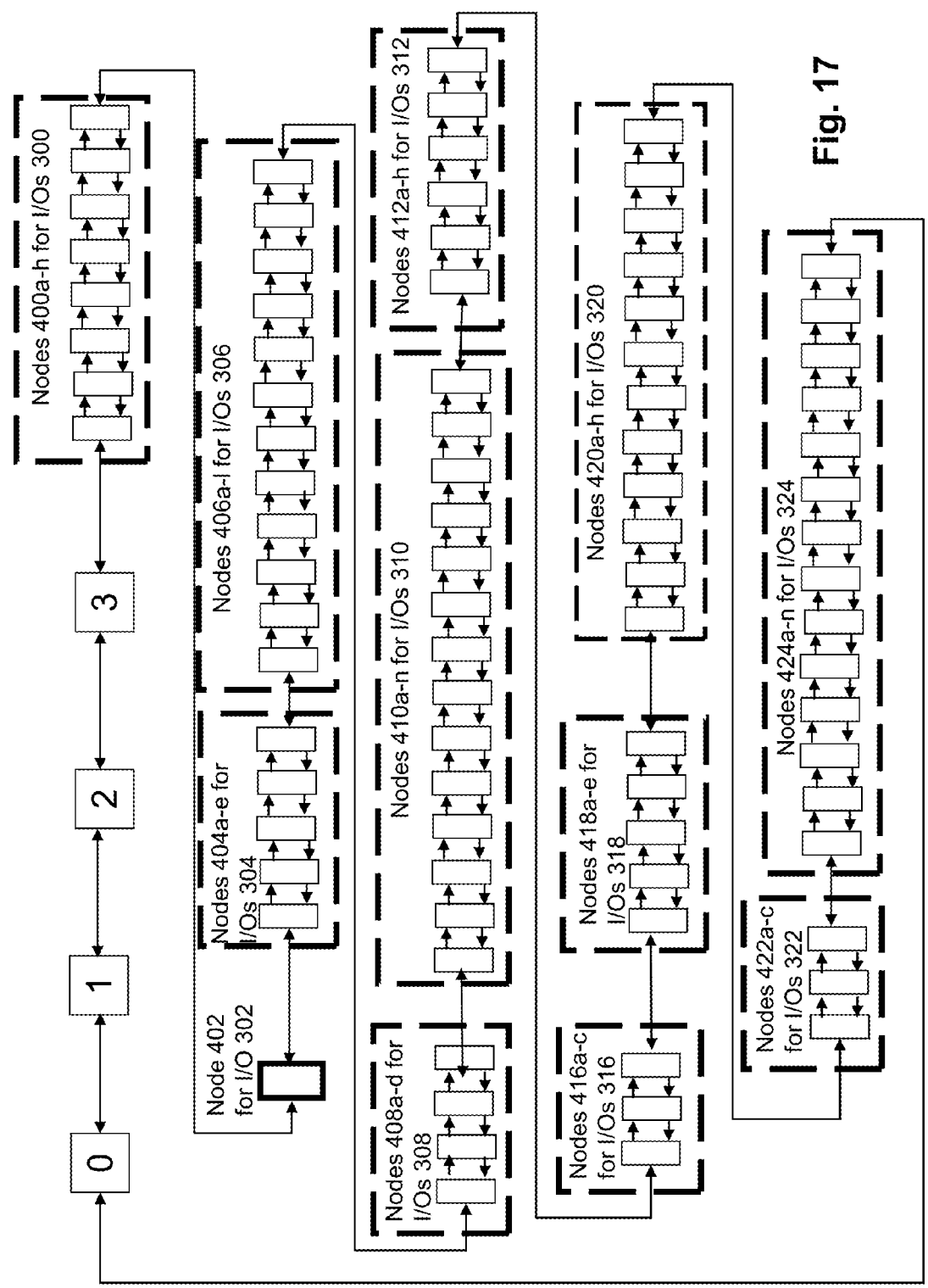

Next, as shown in FIG. 17, nodes corresponding to all of the ordered I/O cells are inserted in order (based upon the order of FIG. 4C) into the I/O ring structure. In this example, the nodes are inserted along the bottom side between corner node 3 and corner node 0. However, as before, it can be appreciated that the nodes can be inserted into any side, so long as the desired ordering is maintained.

Here, nodes 400a-h are inserted which corresponds to a segment having six components of type 300 and two power and ground nodes (as specified in FIG. 3). A single node 402 corresponding to the one component of type 302 is inserted after nodes 400a-h. Nodes 404a-e are inserted which corresponds to a segment having five components of type 304. Nodes 406a-l are inserted which corresponds to a segment having ten components of type 306 and two power and ground nodes. Nodes 408a-d are inserted which corresponds to a segment having four components of type 308. Nodes 410a-n are inserted which corresponds to a segment having ten components of type 310 and four power and ground nodes. Nodes 412a-h are inserted which corresponds to a segment having four components of type 312 and two power and ground nodes. Nodes 416a-c are inserted which corresponds to a segment having three components of type 316. Nodes 418a-e are inserted which corresponds to a segment having five components of type 318. Nodes 422a-c are inserted which corresponds to a segment having three components of type 322. Nodes 424a-n are inserted which corresponds to a segment having ten components of type 324 and four power and ground nodes.

Figure 18:
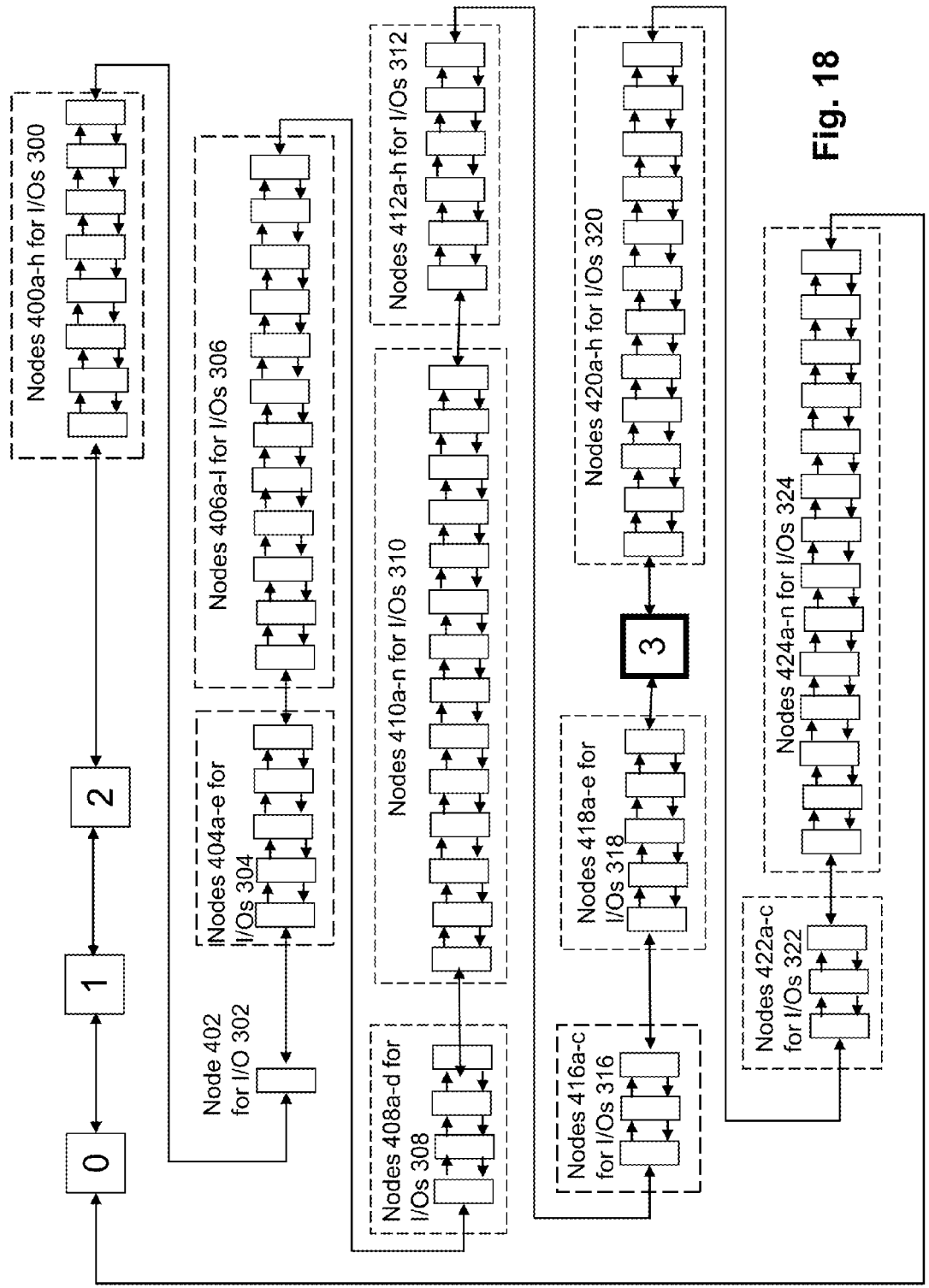
Figure 19:
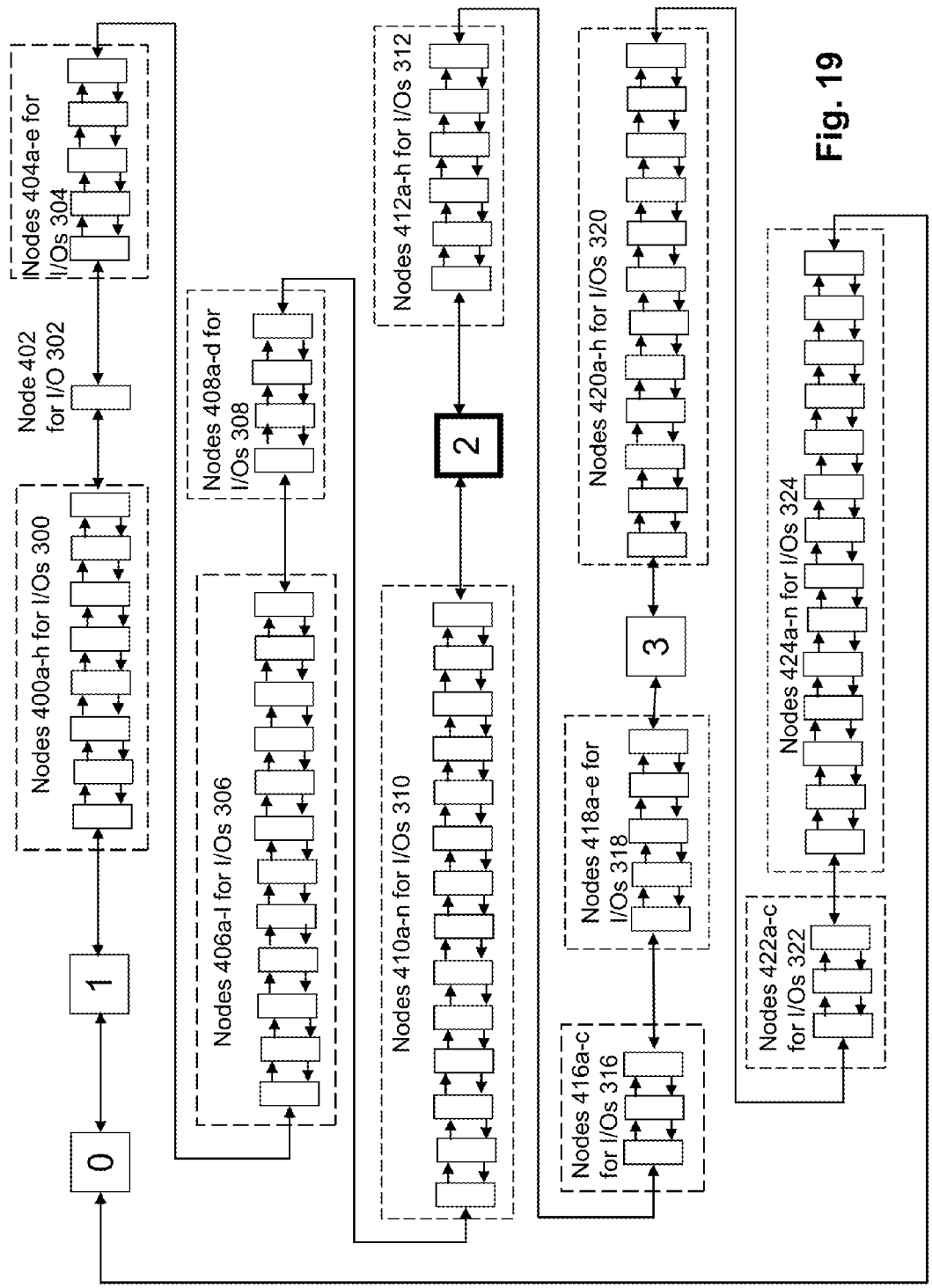

The corner nodes will now be shifted to attempt to balance the length of each side to match the desired aspect ratio. Any of the corner nodes can be moved to accomplish this. Since the imbalance in the dies is caused by the excess number of nodes between corner nodes 3 and 0, either corner 3 or corner 0 can be shifted at this time to remove some of the excess. For example, as shown in FIG. 18, corner node 3 can be shifted between the nodes 418a-e and nodes 420a-h. As shown in FIG. 19, corner node 2 can then be shifted between the nodes 410a-n and nodes 412a-h.

Figure 20:
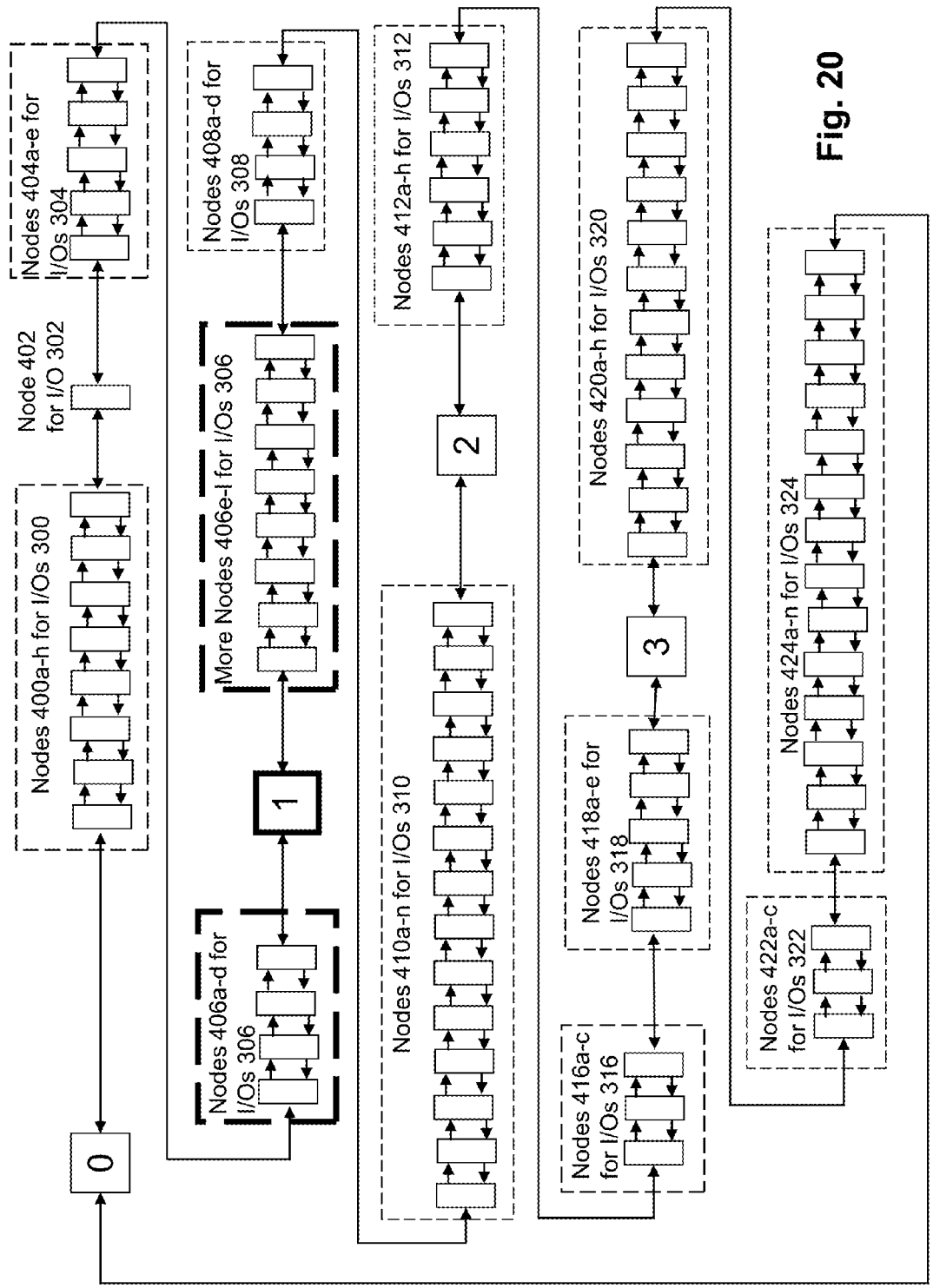

As shown in FIG. 20, corner node 1 can be shifted as well, such that a segment is divided by a corner node. Here, corner node 1 is shifted in a way that separates the nodes 406a-l into two groups of nodes, nodes 406a-d and nodes 406e-l. Nodes 406a-d now reside between corner nodes 0 and 1, indicating that the components corresponding to these nodes are placed on the left side of the I/O ring. Nodes 406e-l reside between corner nodes 1 and 2, indicating that the components corresponding to these nodes are placed on the top side of the I/O ring.

To the extent required, one or more fillers can be placed into the ring structure. For example, a node 414 corresponding to fill structure 314 can be inserted between the segments for nodes 412a-h and nodes 418a-e.

At this point, the desired aspect ratio has been generally achieved as previously shown in FIG. 15. Unlike the approach of FIGS. 5-14, no additional optimizations are needed in this approach to make sure the cells that are pre-assigned to a particular side are actually placed on that side of the I/O ring. Instead, the original ordering of the I/O cells was configured to ensure that the cells, when placed in order, will cause the cells with pre-assigned sides to be placed at the correct side.

Other and additional types of optimizations may be implemented for the I/O ring of FIG. 15. For example, some or all of the nodes can be shifted to attempt to remove the fill 414. In addition, stacking can potentially be used to reduce the die size. Moreover, corner packing may be employed to remove the space taken up by the corner nodes.

Figure 21:
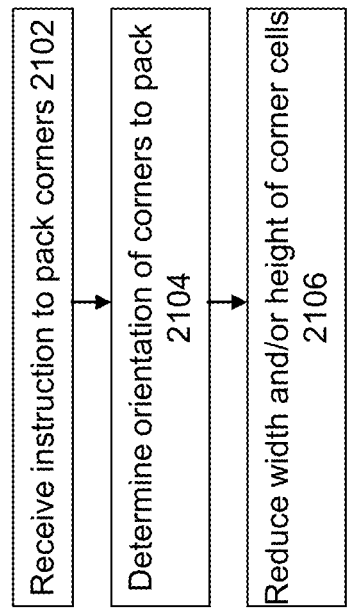
FIG. 21 illustrates a flow of an approach for packing corners according to some embodiments of the invention.

FIG. 21 shows a flowchart of a process for packing corners according to some embodiments of the invention. At 2102, the process receives instructions to pack corners. As previously discussed, corner packing is more likely to be used for configurations where the corners can be populated with substantive I/O cells, such as flip-chip design configurations.

According to some embodiments, corner packing is implemented by taking the width or length parameters of the corner cells (0, 1, 2, and 3), and setting the width or height values of the corner cells to zero. If the width value is zero, this means that the adjacent I/O cell along the width of the I/O periphery would essentially be "pushed" into the corner at the location of the corner cell. The corner cell would still exist in the structure, but since it has a zero width value, it would cot contribute to any of the "beachfront" along the width of the ring periphery. Similarly, the height value of the corner cell can be set to zero. This allows the adjacent I/O cell along the height perimeter of the corner cell to slide over and occupy the corner of the I/O ring.

The selection of which width or height value to set to zero for the corner cell can be subject to any suitable design consideration. For example, at 2104, the orientations of the corners can be checked for the appropriate adjacent cell to pack into the corner, where the one that provides the greatest die size savings is selected to slide into the corner. The selected I/O cell will therefore determine which of the width or height parameters to adjust for the corner cell. Thereafter, at 2106, either the width or height value of the corner cell is adjusted to a zero value to allow the corner to be packed.

Figure 22:
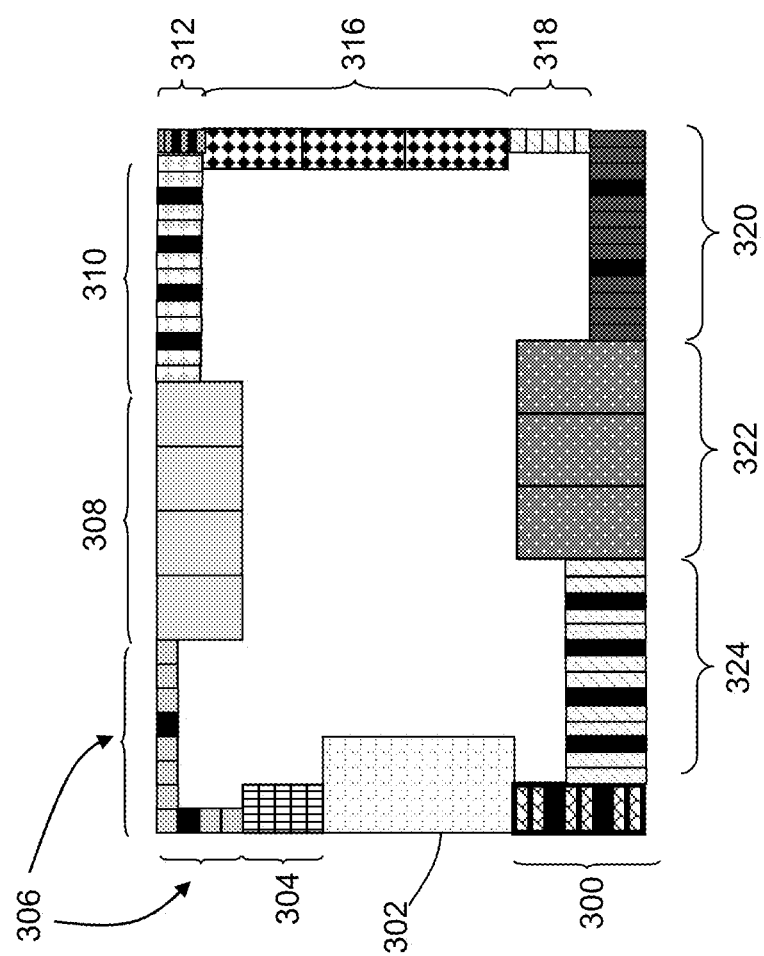
FIG. 22 illustrates an I/O ring with packed corners according to some embodiments of the invention.

FIG. 22 shows a revised version of the I/O ring of FIG. 15, where the corners have been packed. It can be see that the corner cells no longer visually appear in the I/O ring after corners have been packed.

Figure 23:
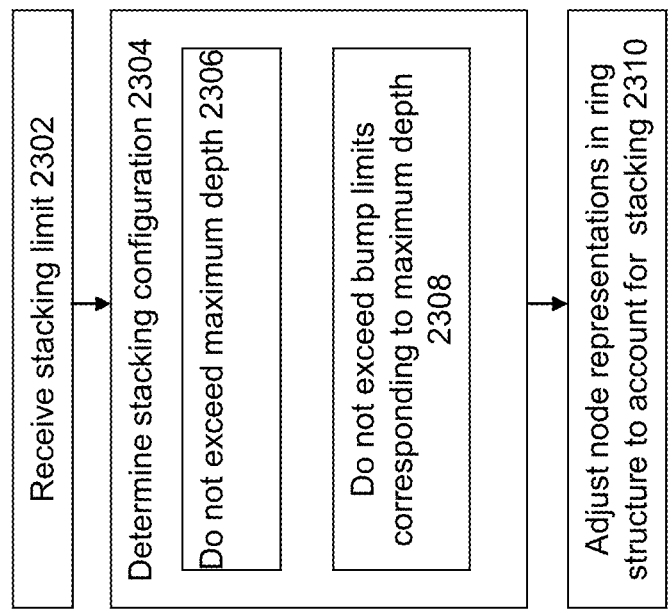
FIG. 23 illustrates a flow of an approach for stacking I/O cells according to some embodiments of the invention.

FIG. 23 shows a flowchart of a process for stacking I/O cells according to some embodiments of the invention. The process receives a stacking limit at 2302. In some embodiments, the stacking limit corresponds to a maximum specified distance into the core at which stacking may occur. For example, the engineer/designer may specify that stacking can occur up to 1000 microns into the core.

Next, at 2304, stacking configurations are considered to implement stacking. According to one embodiment, stacking can only be performed for an I/O cell type for which stacking is enabled. If not enabled, then the cell type cannot be stacked. In some embodiments, the default setting for a cell type is to turn off stacking.

The stacking configuration is made based upon at least two factors: the maximum stacking distance and maximum bump limits. As shown in 2306, the I/O cells can be stacked only if the maximum stacking distance is not exceeded. Therefore, stacking can occur up until the addition of one more stacking layer will cause the physical space occupied by the I/O cells to exceed the maximum stacking depth into the core.

In addition, as shown in 2308, another possible stacking limitation is a maximum bump limit. The maximum stacking distance may correspond to a given set of bumps, taking into account the bump density of the IC product. Therefore, this additional limitation on stacking is configured to limit stacking only to the number of bumps within the maximum stacking distance, even if the footprint of the stacked I/O cells is less than that maximum stacking distance. This anticipates that the stacked I/O cells may consume enough bumps such that it reaches the bump limit before its footprint reaches the maximum stacking distance into the core.

Once the stacking configuration is established, then the node representation for the stacked I/O cells is adjusted at 2310 to account for the stacking. As described above, the nodes may be tiled together to indicate stacking of components, where tile width and tile height parameters may be employed to track stacking of nodes. The tile width parameter identifies the stacked nodes along the width (or edge) of the die and the tile height parameter identifies the stacked nodes that occurs into the core of the die. The total stacking is based upon the tile width times the tile height parameters. For example, if there are six I/O cells to place, and the cells are stacked such that three are along the edge and the stacking extends two cells deep into the core, then the tile width parameter is "3" and the tile height parameter is "2", where 3 (tile width value) times 2 (tile height value) equals 6, which is then total number of cells being stacked. The total width and height of the stacked cells is calculated by looking at the tile width and tile height values.

Therefore, what has been described is an improved approach for implementing I/O ring structures. The design of the I/O ring may be automatically generated in an accurate way even very early in the design process. The generated I/O ring arrangement can be used to perform chip planning and estimation, and can also be sent to later design stages to construct the final versions of the I/O ring.

A unique ring data structure is constructed and populated to generate and optimize the I/O ring. The ring data structure comprises a linked list of nodes that correspond to the I/O cells in the I/O ring. The list of nodes is initialized to create a desired order for the I/O cells. The list of I/O cells is used to populate a ring data structure, where nodes in the ring data structure correspond to I/O cells in the I/O ring.

This approach to generating an I/O ring allows the I/O ring to be automatically generated to comply with a target ratio, and also to be optimized to achieve the target ratio while minimizing the die size. In addition, specific I/O placement directives can be implemented to place certain I/O cells at particular locations within the I/O ring, e.g., to specify the location of cell at particular sides of the I/O ring.

I/O proximities are retained, by making sure the same types of components are placed near or adjacent to one another. The grouping of nodes for similar components into segments can be used to accomplish this goal. I/O ordering can be implemented, by populating the ring data structure with the nodes in a designated order.

Many additional types of optimizations may be implemented using embodiments of the invention. For example, corner packing may be used to pack I/O cells into corners of the I/O ring. Stacking may be employed to stack I/O cells at the ring periphery. Rotation restrictions may be implemented to limit the certain I/O components to certain orientations depending upon whether the components are placed at certain locations or sides on the I/O ring. Finally, the optimizations can be used to fine tune the amount of required core space to the amount of required I/O periphery to minimize die sizes.

System Architecture Overview

Figure 24:
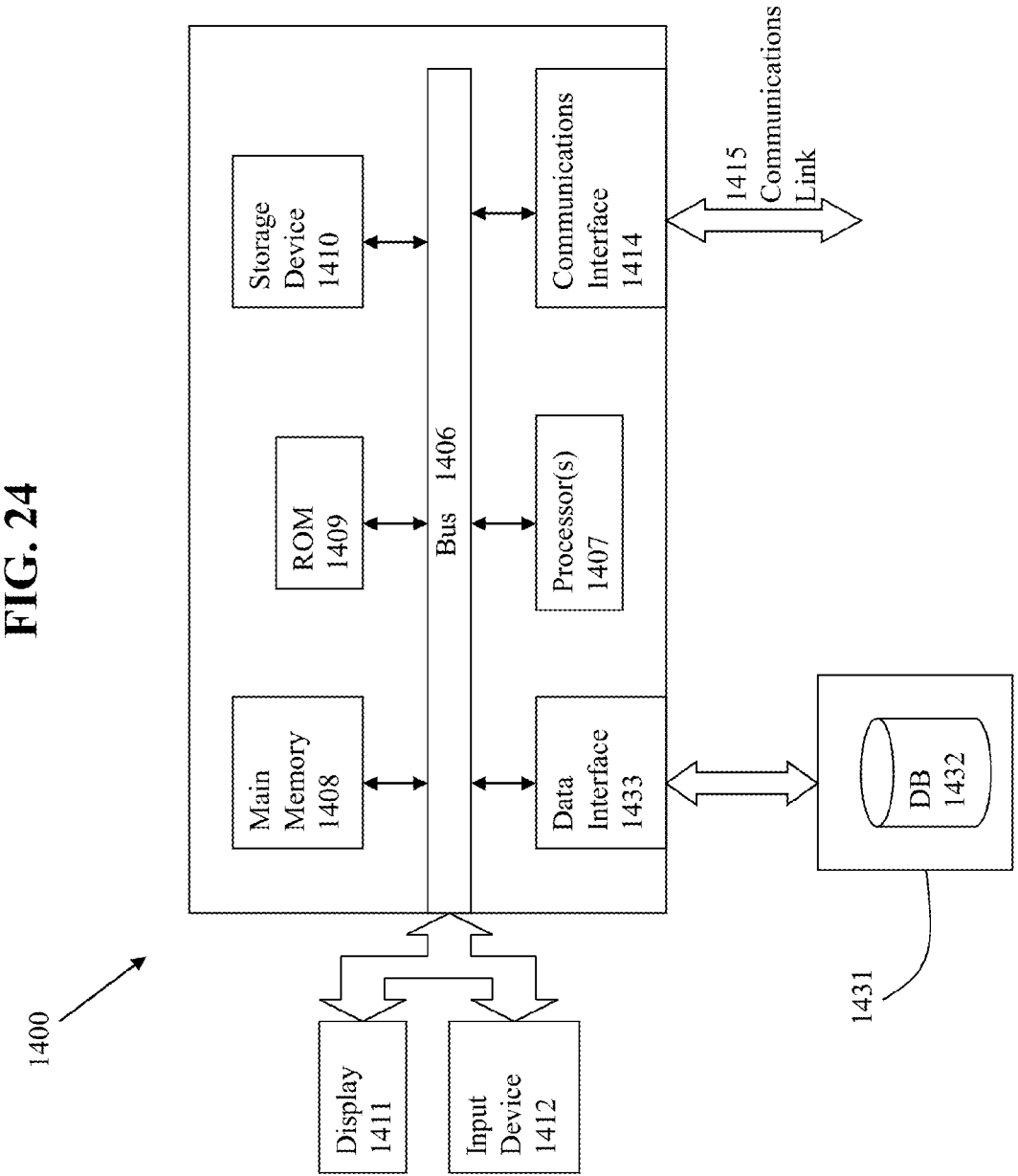
FIG. 24 shows an architecture of an example computing system with which the invention may be implemented.

FIG. 24 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer-implemented method for implementing an I/O Ring structure, comprising using a processor to the following:
   receiving specification information for an I/O ring for an electronic design;
   implementing a circularly linked list of nodes for the I/O ring, wherein a node in the linked list of nodes represents an element of the I/O ring,
   implementing corner nodes in the linked list of nodes, wherein each of the corner nodes corresponds to a corner of the I/O Ring, and wherein the corner nodes are capable of being shifted after their placement within the I/O ring; and
   implementing I/O component nodes in the linked list of nodes, wherein each of the I/O component nodes corresponds to an I/O component in the I/O Ring.

2. The computer-implemented method of claim 1, in which the I/O ring corresponds to a rectangular structure, and the linked list of nodes comprises four corner nodes.

3. The computer-implemented method of claim 1 in which the linked list of nodes is a doubly-linked list, where the nodes in the doubly linked list are linked to both adjacent forward and backwards neighbors.

4. The computer-implemented method of claim 1 in which multiple I/O components are grouped together into a single node.

5. The computer-implemented method of claim 4 in which a pointer is used to point from a representative node to individual nodes.

6. The computer-implemented method of claim 1 in which a node is displayed with a visually distinctive characteristic to distinguish one node from another.

7. The computer-implemented method of claim 6 in which coloring is used to provide the visually distinctive characteristic.

8. The computer-implemented method of claim 1 in which height or width of a node varies depending upon a location of the node in the linked list.

9. The computer-implemented method of claim 1 in which the specification information comprises information that specifies whether a node must be placed along a given location on the I/O ring.

10. The computer-implemented method of claim 1 in which I/O components are stacked.

11. The computer-implemented method of claim 1 in which an ordering is specified for the I/O ring prior to implementing the linked list.

12. The computer-implemented method of claim 1 in which the specification information comprises a set of constraints.

13. The computer-implemented method of claim 1 in which power and ground components are identified for the I/O ring.

14. The computer-implemented method of claim 1 in which only the nodes that are not pre-assigned to a given side of the I/O ring are ordered, where nodes are inserted at appropriate locations between the corner nodes for components which must be placed at certain locations or sides of the I/O ring, and which is followed by inserting the rest of the I/O components in specified order into the ring structure.

15. The computer-implemented method of claim 1 in which all nodes are pre-ordered, including nodes for cells that are pre-assigned to a given side of the I/O ring, and where the pre-ordering will account for the side at which certain nodes must be placed.

16. The computer-implemented method of claim 1 in which balancing is performed to adjust the I/O components on sides of the I/O ring structure.

17. The computer-implemented method of claim 16 in which balancing is performed by shifting each of the corner nodes within the ring structure to achieve side lengths for the I/O ring that generally approximate a target aspect ratio that was provided as part of constraints for the ring design.

18. The computer-implemented method of claim 1 in which deficit based pushing is employed to shift the corner nodes, where a determination is made of sides that have excess nodes/width lengths, and width information is used to determine side lengths for each node in the ring structure, taking into account any variations based upon different width values that may exist for components when placed along different sides of the ring, in which the corner nodes are walked to shift nodes from the sides with excess width lengths to sides that have a deficit of width lengths, the walking of corner nodes continues until target ratio is approximately reached.

19. The computer-implemented method of claim 18 in which one or more filler nodes are inserted along one or more of the sides to balance the sides and to reach the target aspect ratio.

20. The computer-implemented method of claim 1 in which optimization is performed to position nodes to reduce an amount of fill space along a periphery.

21. The computer-implemented method of claim 20 in which the optimization is performed if the design is I/O limited such that a required core area is smaller than an area formed by a current I/O ring configuration.

22. The computer-implemented method of claim 20 in which reducing the amount of fill is implemented to allow a die size to also shrink, subject to keeping of sufficient space for a core.

23. The computer-implemented method of claim 20 in which an optimization is performed to manipulate the corner nodes to shrink a die size.

24. The computer-implemented method of claim 23 in which the optimization is performed by placing larger I/O cells towards the middle of sides, leaving smaller I/O cells in corners, where corner nodes are configured to match height of adjacent cells, which allows the corner nodes to be implemented with smaller dimensions.

25. The computer-implemented method of claim 1 in which corner packing is performed.

26. The computer-implemented method of claim 25 in which a width or length of the corner nodes is reduced to zero.

27. A computer program product embodied on a non-transitory computer readable medium, the computer readable medium having stored thereon a sequence of instructions which, when executed by a processor, causes the processor to implement an I/O Ring structure, where the I/O Ring structure comprises a circularly linked list of nodes for an I/O ring, wherein a node in the linked list of nodes represents an element of the I/O ring, the I/O Ring structure comprising corner nodes in the linked list of nodes, wherein each of the corner nodes corresponds to a corner of the I/O Ring, and wherein the corner nodes are capable of being shifted after their placement within the I/O ring; and I/O component nodes are implemented in the linked list of nodes, wherein each of the I/O component nodes corresponds to an I/O component in the I/O Ring.

28. The computer program product of claim 27, in which the I/O ring corresponds to a rectangular structure, and the linked list of nodes comprises four corner nodes.

29. The computer program product of claim 27 in which the linked list of nodes is a doubly-linked list, where the nodes in the doubly linked list are linked to both adjacent forward and backwards neighbors.

30. The computer program product of claim 27 in which multiple I/O components are grouped together into a single node.

31. The computer program product of claim 30 in which a pointer is used to point from a representative node to individual nodes.

32. The computer program product of claim 27 in which a node is displayed with a visually distinctive characteristic to distinguish one node from another.

33. The computer program product of claim 32 in which coloring is used to provide the visually distinctive characteristic.

34. The computer program product of claim 27 in which height or width of a node varies depending upon a location of the node in the linked list.

35. The computer program product of claim 27 in which specification information is received comprises information that specifies whether a node must be placed along a given location on the I/O ring.

36. The computer program product of claim 27 in which balancing is performed to adjust the I/O components on sides of the I/O ring structure.

37. The computer program product of claim 27 in which deficit based pushing is employed to shift the corner nodes, where a determination is made of sides that have excess nodes/width lengths, and width information is used to determine side lengths for each node in the ring structure, taking into account any variations based upon different width values that may exist for components when placed along different sides of the ring, in which the corner nodes are walked to shift nodes from the sides with excess width lengths to sides that have a deficit of width lengths, the walking of corner nodes continues until a target ratio is approximately reached.

38. A system for implementing an I/O ring structure, comprising:
   a processor;
   a memory for holding programmable code; and
   wherein the programmable code which when executed by the processor, causes the processor to perform the operations for receiving specification information for an I/O ring for an electronic design, implementing a circularly linked list of nodes for the I/O ring, wherein a node in the linked list of nodes represents an element of the I/O ring, implementing corner nodes in the linked list of nodes, wherein each of the corner nodes corresponds to a corner of the I/O Ring, and wherein the corner nodes are capable of being shifted after their placement within the I/O ring, and implementing I/O component nodes in the linked list of nodes, wherein each of the I/O component nodes corresponds to an I/O component in the I/O Ring.

39. The system of claim 38 in which the I/O ring corresponds to a rectangular structure, and the linked list of nodes comprises four corner nodes.

40. The system of claim 38 in which the linked list of nodes is a doubly-linked list, where the nodes in the doubly linked list are linked to both adjacent forward and backwards neighbors.

41. The system of claim 38 in which multiple I/O components are grouped together into a single node.

42. The system of claim 41 in which a pointer is used to point from a representative node to individual nodes.

43. The system of claim 38 in which a node is displayed with a visually distinctive characteristic to distinguish one node from another.

44. The system of claim 43 in which coloring is used to provide the visually distinctive characteristic.

45. The system of claim 38 in which height or width of a node varies depending upon a location of the node in the linked list.

46. The system of claim 38 in which specification information comprises information that specifies whether a node must be placed along a given location on the I/O ring.

47. The system of claim 38 in which balancing is performed to adjust the I/O components on sides of the I/O ring structure.

48. The system of claim 38 in which deficit based pushing is employed to shift the corner nodes, where a determination is made of sides that have excess nodes/width lengths, and width information is used to determine side lengths for each node in the ring structure, taking into account any variations based upon different width values that may exist for components when placed along different sides of the ring, in which the corner nodes are walked to shift nodes from the sides with excess width lengths to sides that have a deficit of width lengths, the walking of corner nodes continues until a target ratio is approximately reached.

* * * * *